US012571129B2

(12) United States Patent (10) Patent No.: US 12,571,129 B2
Kim et al. (45) Date of Patent: Mar. 10, 2026

(54) TWO-DIMENSIONAL VERTICAL COMPOSITE LAMINATE INCLUDING GRAPHENE AND HEXAGONAL BORON NITRIDE AND METHOD OF FABRICATING SAME

(71) Applicant: POSTECH Research and Business Development Foundation, Pohang-si (KR)

(72) Inventors: Cheol-Joo Kim, Pohang-si (KR); Seong-Jun Yang, Pohang-si (KR); Ju Hyun Jung, Pohang-si (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 106 days.

(21) Appl. No.: 18/536,545

(22) Filed: Dec. 12, 2023

(65) Prior Publication Data

US 2024/0263350 A1 Aug. 8, 2024

(30) Foreign Application Priority Data

Feb. 3, 2023 (KR) ........................ 10-2023-0014576
Sep. 25, 2023 (KR) ........................ 10-2023-0128214

(51) Int. Cl.
*B32B 9/00* (2006.01)
*C30B 25/18* (2006.01)
(Continued)

(52) U.S. Cl.
CPC .............. *C30B 29/68* (2013.01); *C30B 25/18* (2013.01); *C30B 29/02* (2013.01); *C30B 29/40* (2013.01);
(Continued)

(58) Field of Classification Search
CPC .......... C30B 25/18; C30B 29/02; C30B 29/40
See application file for complete search history.

(56) References Cited

U.S. PATENT DOCUMENTS

2019/0055129 A1 2/2019 Dimitrakopoulos et al.

FOREIGN PATENT DOCUMENTS

CN 103579407 A * 2/2014
CN 104562195 A * 4/2015
(Continued)

OTHER PUBLICATIONS

Seong-Jun Yang et al., "Wafer-Scale Programmed Assembly of One-Atom-Thick Crystals", Nano Lett. 2022, 22, 1518-1524, Feb. 4, 2022.

(Continued)

*Primary Examiner* — Daniel H Miller
(74) *Attorney, Agent, or Firm* — LEX IP MEISTER, PLLC

(57) ABSTRACT

Proposed are a two-dimensional vertical composite laminate including graphene and hexagonal boron nitride and a method of fabricating the same. The composite laminate includes a first layer and a second layer positioned on the first layer, in which the first layer includes a first boron nitride layer containing hexagonal boron nitride or a first graphene layer containing graphene, and the second layer includes a second boron nitride layer containing hexagonal boron nitride or a second graphene layer containing graphene. The composite laminate allows for the control of the twist angle and stacking order of each layer, so that the composite laminate can have the desired crystal structure, crystal thickness, and composition to exhibit novel physical properties.

12 Claims, 20 Drawing Sheets

(51) Int. Cl.

| | | |
|---|---|---|
| *C30B 29/02* | (2006.01) | |
| *C30B 29/40* | (2006.01) | |
| *C30B 29/68* | (2006.01) | |
| *G02B 5/30* | (2006.01) | |
| *H10D 48/00* | (2025.01) | |

(52) U.S. Cl.
CPC ......... *G02B 5/3025* (2013.01); *H10D 48/383* (2025.01)

(56) References Cited

FOREIGN PATENT DOCUMENTS

| | | | |
|---|---|---|---|
| CN | 107579156 | * | 1/2018 |
| JP | 2022-549575 | | 11/2022 |
| KR | 10-2016-0113769 | | 10/2016 |
| KR | 10-2022-0014995 | | 2/2022 |
| WO | WO 2017023380 | * | 2/2017 |

OTHER PUBLICATIONS

Seong-Jun Yang et al., "Wafer-Scale Programmed Assembly of One-Atom-Thick Crystals", Pohang University of Science and Technology, Gordon Research Conference, Jun. 12-17, 2022, Southern New Hampshire University.

Seong-Jun Yang et al., "Wafer-scale layer-by-layer assembly of one-atom-thick crystals", The 9th Korean Symposium on Graphene and 2D Materials, Jul. 11-12, 2022, Hanhwa Resort Haeundae.

Cheol-Joo Kim, "Grain boundary engineering in two-dimensional materials", Department of Chemical Engineering, Pohang University of Science and Technology, Dec. 27, 2022.

KIPO, Office Action of KR 10-2023-0128214 dated Sep. 29, 2025, total 15 pages.

Ming Huang et al., "Substrate Engineering for CVD Growth of Single Crystal Graphene", Small Methods, vol. 5, Issue 5, 2001213, May 12, 2021, total 29 pages.

* cited by examiner

FIG. 1

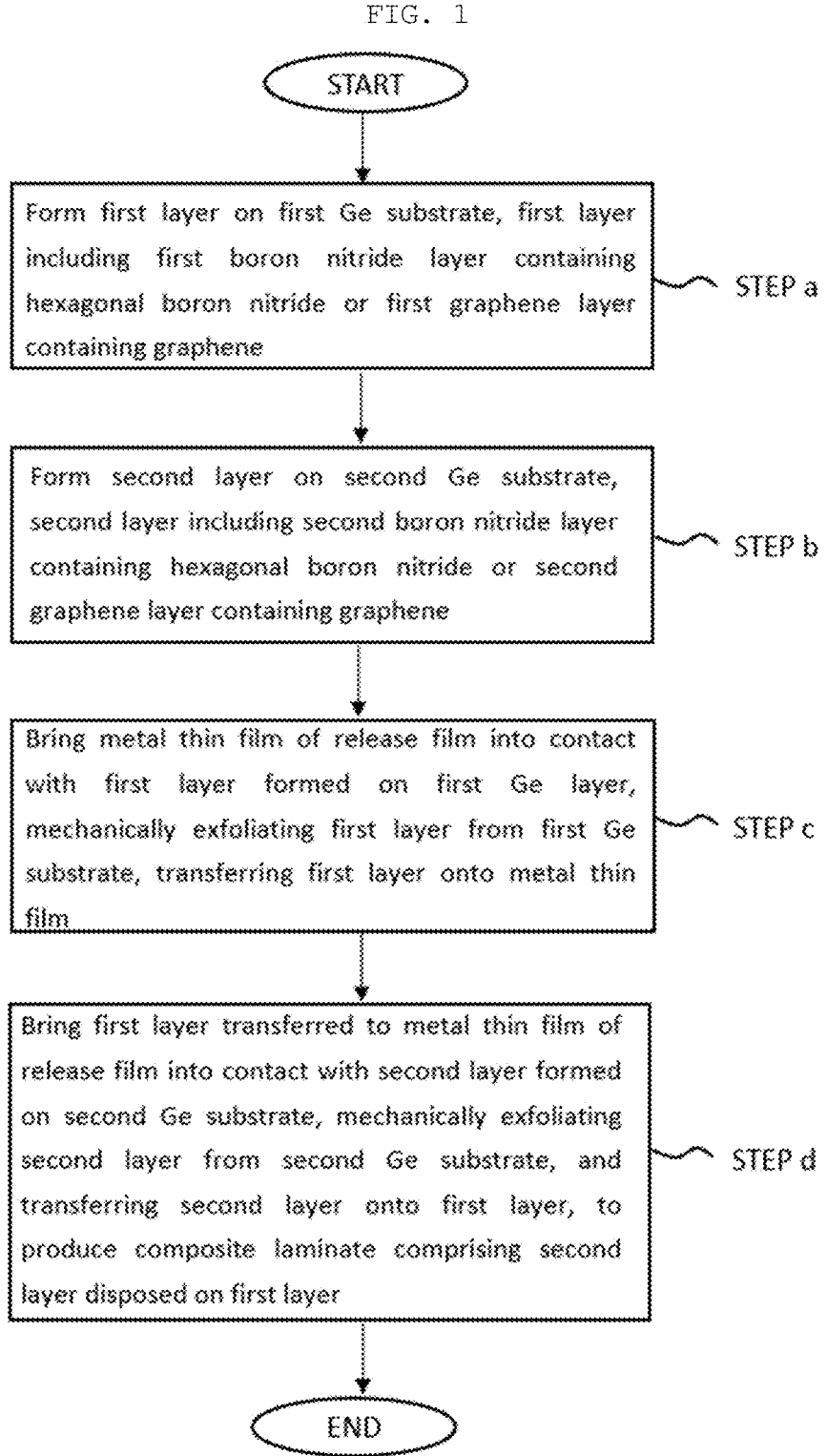

START

Form first layer on first Ge substrate, first layer including first boron nitride layer containing hexagonal boron nitride or first graphene layer containing graphene — STEP a Form second layer on second Ge substrate, second layer including second boron nitride layer containing hexagonal boron nitride or second graphene layer containing graphene — STEP b Bring metal thin film of release film into contact with first layer formed on first Ge layer, mechanically exfoliating first layer from first Ge substrate, transferring first layer onto metal thin film — STEP c Bring first layer transferred to metal thin film of release film into contact with second layer formed on second Ge substrate, mechanically exfoliating second layer from second Ge substrate, and transferring second layer onto first layer, to produce composite laminate comprising second layer disposed on first layer — STEP d

END

Preparation Example 1-2

Preparation Example 2-2

FIG. 7C
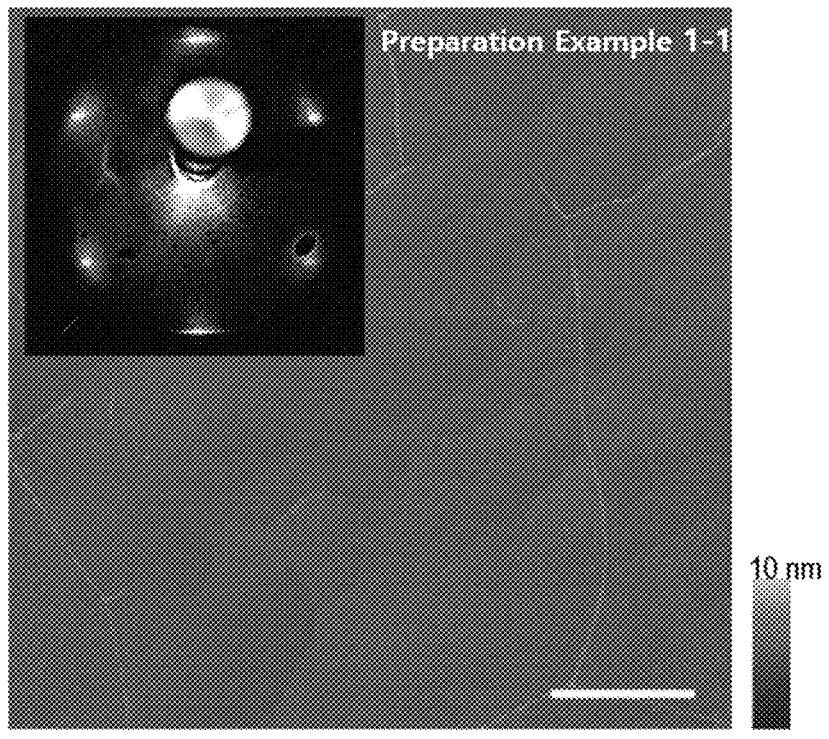
Scale bar : 1 μm
FIG. 7D
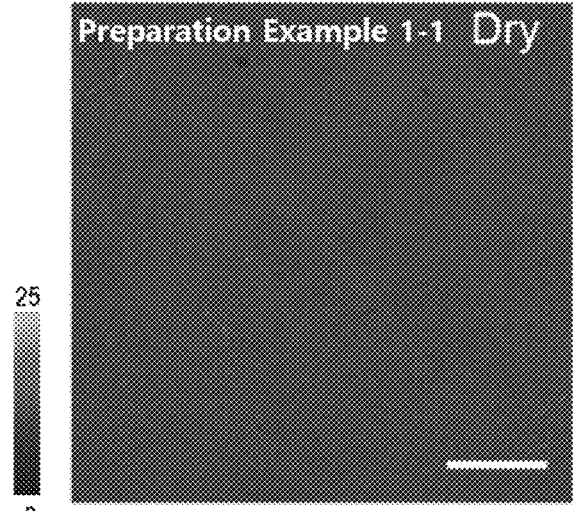
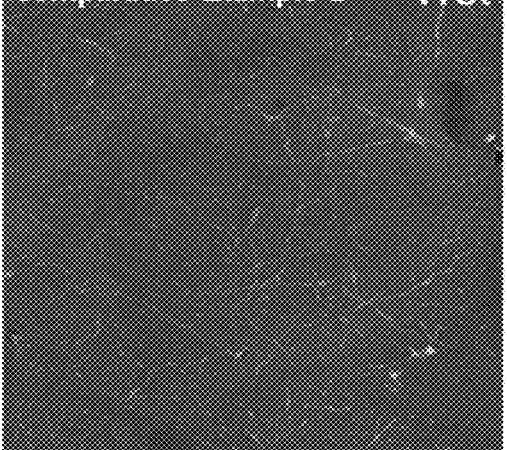
*Scale bar : 1 um

Example 4-1

Example 4-1

Example 3-1-2

Example 3-1-4

Example 3-1-1

Example 3-1-3

FIG. 11C
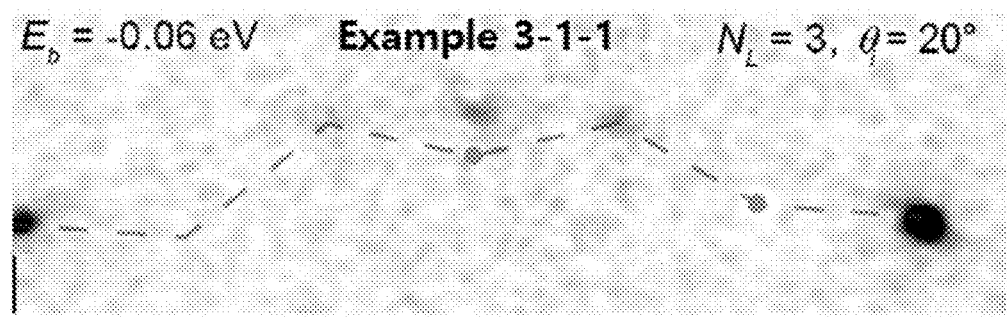
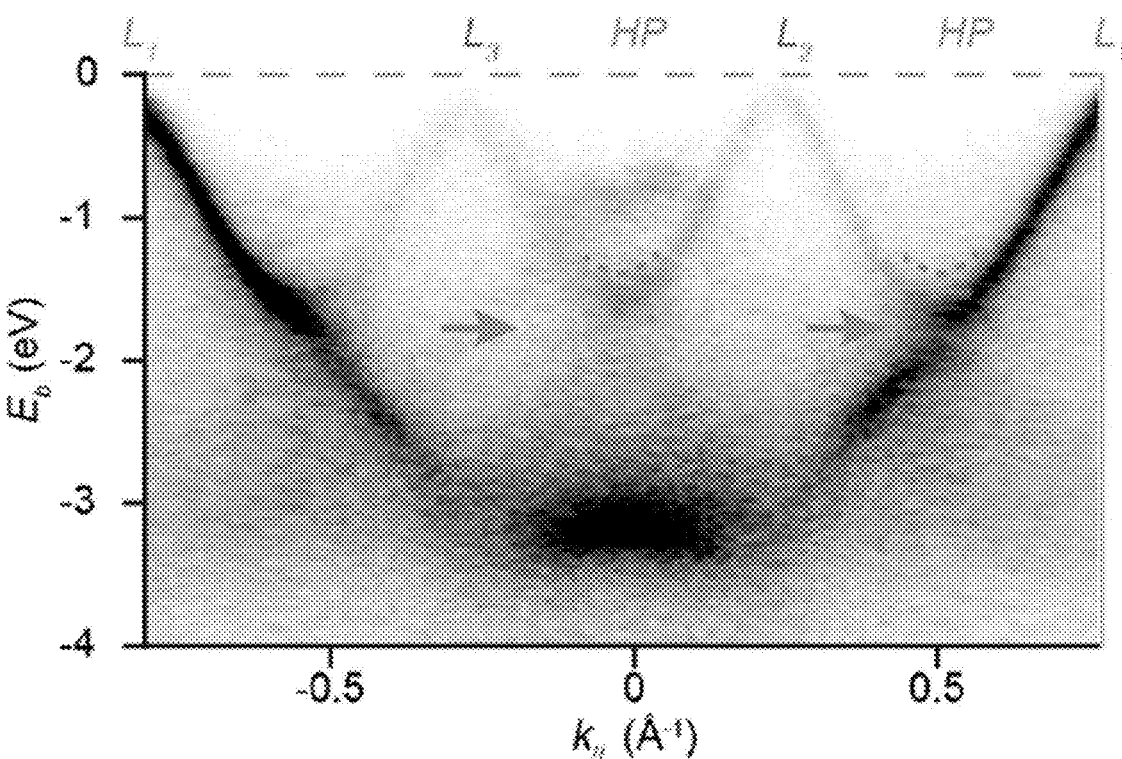

FIG. 11D
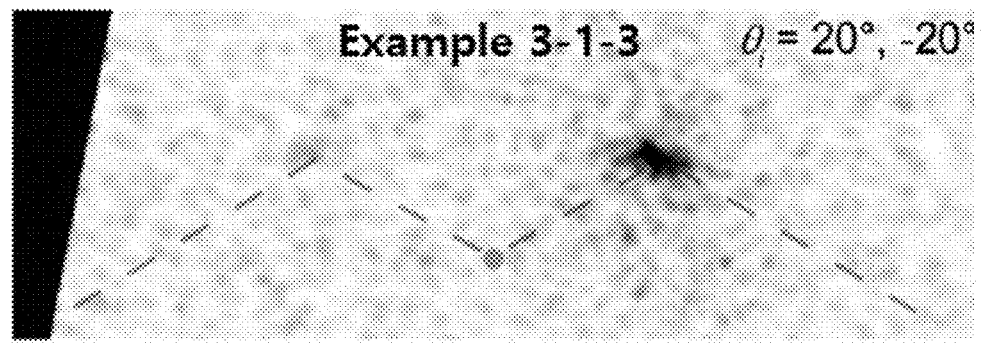
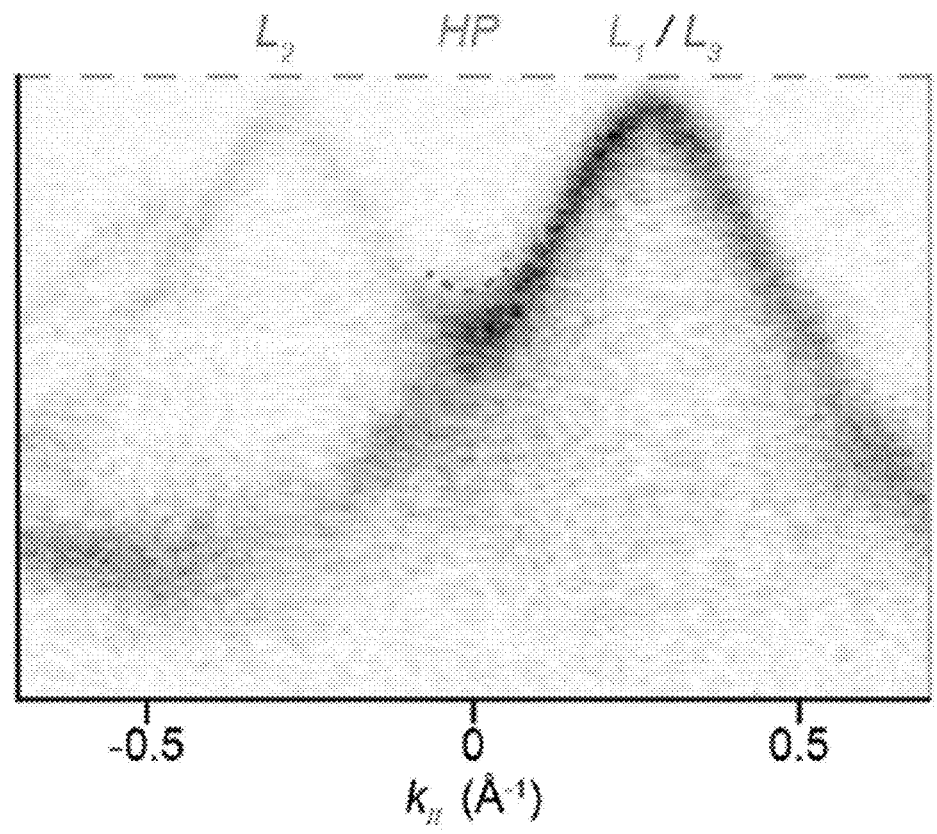
$k_{//}$ (Å⁻¹)

Achiral -> Chiral

FIG. 11F

Achiral                    Chiral(L, R)

3 mm

◯ hBN

◯ hBN

TWO-DIMENSIONAL VERTICAL COMPOSITE LAMINATE INCLUDING GRAPHENE AND HEXAGONAL BORON NITRIDE AND METHOD OF FABRICATING SAME

CROSS REFERENCE TO RELATED APPLICATION

The present application claims priority to Korean Patent Application No. 10-2023-0014576, filed Feb. 3, 2023, and Korean Patent Application No. 10-2023-0128214, filed Sep. 25, 2023, the entire contents of which are incorporated herein for all purposes by this reference.

SUMMARY OF THE DISCLOSURE

1. Field of the Disclosure

The present disclosure relates to a two-dimensional vertical composite laminate including graphene and hexagonal boron nitride layers and a method of fabricating the same.

2. Description of the Related Art

Two-dimensional (2D) materials are materials with a predetermined planar shape and a thickness corresponding to one or a few atoms. The study on such materials is one of the most active research fields in chemistry and materials, and the research topics are diversified through the convergence of electronic, mechanical, and biotechnology fields.

Representative 2D materials include graphene and boron nitride, of which boron nitride has the chemical formula of BN in which boron atoms and nitrogen atoms form a planar 2D hexagonal structure which is a hexagonal crystal structure similar to that of graphite. The chemical and physical properties of BN are similar to those of graphite, so that BN is a highly physically and chemically stable material.

On the other hand, 2D crystalline thin films with an atom-sized thickness have a wide range of physical properties depending on their thickness, atomic structure, and composition. By changing the stacking method of the thin films, different physical properties can be obtained. For example, a laminate formed by twisting stacking layers has different properties from a laminate formed by a layer-by-layer stacking process. However, the past research has only been able to assemble the thin films at very small scales. The reported techniques for assembling large wafer-scale thin films have been limited by the fact that the interfaces are easily contaminated and do not exhibit new properties.

Conventionally, transferring graphene or hexagonal boron nitride suffered from easily contaminated interfaces. The transfer of thin films grown on metal foil was specifically problematic. Since a wet process that dissolves a substrate in an etching solution to separate a thin film from the substrate is used, the residue of the etching solution contaminates graphene and the surface of a target substrate onto which the thin film is to be transferred.

Therefore, it is necessary to develop a technique that can form a high quality interface between graphene and hexagonal boron nitride by solving the problems occurring in the conventional wet process, and a technique for producing a heterogeneous composite laminate having the interface.

SUMMARY OF THE DISCLOSURE

The present disclosure is to provide a composite laminate including 2D materials that are stacked to have predetermined crystal orientations and crystal compositions to offer novel properties depending on the crystal structure, thickness, and composition of the materials.

Additionally, the present disclosure is to provide a wafer-scale composite laminate with dimensions of 5 to 10 cm.

Additionally, the present disclosure is to provide an optical device, transistor, and tunnel device utilizing a composite laminate that is formed with the control of a twist angle, atomic-level thickness, and lamination structure.

Additionally, the present invention is to provide a method of fabricating a composite laminate by exfoliating a 2D material layer from a base substrate without using an etching solution and transferring the exfoliated 2D material layer onto a target substrate or thin film while forming a clean interface.

According to a first aspect of the present disclosure, there is provided a composite laminate including: a first layer including a first boron nitride layer containing hexagonal boron nitride (hBN) or a first graphene layer containing graphene; and a second layer positioned on the first layer and including a second boron nitride layer containing hexagonal boron nitride (hBN) or a second graphene layer containing graphene.

In addition, each of the first layer and the second layer may be stacked in a direction perpendicular to an in-layer direction.

In addition, each of the first boron nitride layer, second boron nitride layer, first graphene layer, and second graphene layer may include an atomic monolayer or may include a plurality of atomic monolayers that are stacked in a direction perpendicular to the atomic monolayer by van der Waals attraction.

In addition, the first layer may include the first graphene layer containing graphene, layer may include the second graphene layer containing graphene, and the composite laminate may further include an n-th graphene layer containing graphene (wherein n is an integer in a range of from 3 to 20). In addition, the second graphene layer may be twisted at a first angle $\theta_1$ with respect to the first graphene layer in the in-layer direction, the n-th graphene layer may be twisted at an (n−1)-th angle $\theta_{(n−1)}$ with respect to the (n−1)-th layer in the in-layer direction (wherein n is an integer in a range of from 3 to 20), and the first angle through the (n−1)-th angle may be angles in a clockwise direction and/or a counterclockwise direction.

In addition, the composite laminate may be an optical chiral member in which all of the first to (n−1)-th angles $\theta_1$ to $\theta_{(n−1)}$ are all angles in a clockwise direction or in a counterclockwise.

In addition, the first layer may include the first boron nitride layer composed of an atomic monolayer of hBN, and the second layer may include the second graphene layer composed of an atomic monolayer of graphene.

In addition, the composite laminate may further include a metal layer, the first layer may include a plurality of the first boron nitride layers each being composed of an atomic monolayer of hBN, the second layer includes the second graphene layer composed of an atomic monolayer of graphene, and the metal layer may be disposed on the first layer and disposed to be opposite to the second layer.

In addition, the composite laminate may be used for fabrication of photodetectors, polarizing films, transistors, and tunnel devices.

According to a second aspect of the present disclosure, there is provided a vicinal plane germanium laminate including: a germanium (Ge) substrate with a vicinal plane (110) single crystalline surface; and a graphene layer or hexagonal boron nitride (hBN) layer formed on the vicinal plane (110) single crystalline surface of the Ge substrate.

In addition, the vicinal plane germanium laminate may further include a metal layer, and the metal layer may be disposed on the graphene layer or hBN layer so as to be opposite to the Ge substrate.

In addition, the vicinal plane (110) single crystalline surface of the Ge substrate may be produced by cutting a Ge substrate in <100> or <111> direction and recrystallizing the resulting Ge substrate.

Additionally, single crystals of the graphene layer or hBN layer may have the same orientation.

According to a second aspect of the present disclosure, there is provided a method of fabricating a composite laminate, the method including: (a) forming a first layer including a first boron nitride layer containing hexagonal boron nitride (hBN) or a first graphene layer containing graphene on a first germanium (Ge) substrate; (b) forming a second layer including a second boron nitride layer containing hBN or a second graphene layer containing graphene on a second Ge substrate; (c) bringing a metal thin film of a release film coated with the metal thin film into contact with the first layer formed on the first Ge substrate, mechanically exfoliating the first layer from the first Ge substrate, and transferring the exfoliated first layer onto the metal thin film of the release film; and (d) bringing the first layer transferred to the metal thin film of the release film into the second film formed on the second Ge substrate, exfoliating the second layer from the second Ge substrate, and transferring the second layer onto the first layer, thereby producing the composite laminate in which the second layer is disposed on the first layer.

The mechanical exfoliation may be carried out by utilizing a difference in the Van der Waals attraction.

In addition, the van der Waals attraction between the metal film and the first layer may be stronger than the van der Waals attraction between the first layer and the first Ge substrate, and the van der Waals attraction between the first layer and the second layer may be stronger than the van der Waals attraction between the second layer and the second Ge substrate.

The Ge substrate may have a germanium (110) single crystalline surface, or a germanium (110) single crystalline surface with a vicinal plane.

In addition, the vicinal plane (110) single crystalline surface of the Ge substrate may be formed by cutting a Ge substrate in <100> or <111> direction and then recrystallizing the resulting Ge substrate.

The formation of the first layer in step (a) or the formation of the second layer in step (b) may be performed by chemical vapor deposition (CVD).

According to a third aspect of the present disclosure, there is provided a method of fabricating a chiral or achiral composite laminate, the method including: (1) forming a first layer including a first graphene layer containing graphene on a first Ge substrate; (2) forming a second layer including a second graphene layer containing graphene on a second Ge substrate; (3) forming an n-th layer including an n-th graphene layer containing graphene on an n-th Ge substrate, wherein n is an integer in a range of from 3 to 20; (4) bringing a metal thin film of a release film coated with the metal thin film into contact with the first layer formed on the first Ge substrate, mechanically exfoliating the first layer from the first Ge substrate, and transferring the exfoliated first layer onto the metal thin film of the release film; and (5) bringing the first layer transferred onto the metal thin film of the release film into contact with the second layer formed on the second Ge substrate, mechanically exfoliating the second layer from the second Ge substrate, and transferring the exfoliated second layer onto the first layer; and (6) bringing the second layer transferred onto the first layer into contact with the n-th layer formed on the n-th Ge substrate, wherein n is an integer in a range of from 3 to 20, mechanically exfoliating the n-th layer from the n-th Ge substrate, and transferring the exfoliated n-th layer onto the second layer to produce a composite laminate including the first layer, the second layer, . . . , (n–1)-th layer, and the n-th layer.

The second graphene layer is twisted at a first angle $\theta 1$ with respect to the first graphene layer in an in-layer direction, the n-th graphene layer is twisted at an (n–1)-th angle $\theta_{(n-1)}$ with respect to the (n–1)-th graphene layer (wherein n is an integer in a range of from 3 to 20) in the in-layer direction, and the first angle trough the (n–1)-th angle may be angles in a clockwise direction and/or a counterclockwise direction.

The heterogeneous composite laminate of the present disclosure allows for the control of the twist angle and stacking order of each layer, thereby enabling the fabrication of a composite laminate with the desired crystal structure, crystal thickness, and composition to off novel properties.

In addition, the heterogeneous composite laminate fabrication method of the present disclosure enables the exfoliation of a two-dimensional material layer without using an etching solution, and the transfer of the exfoliated two-dimensional material layer onto the desired target substrate or thin film with pristine interfaces.

In addition, the heterogeneous composite laminate fabrication method of the present disclosure can stack two-dimensional materials to have predetermined crystalline orientations, crystalline compositions, etc.

BRIEF DESCRIPTION OF THE DRAWINGS

Since the accompanying drawings are intended to illustrate exemplary embodiments of the present disclosure, the technical ideas of the present invention should not be construed to be limited by the accompanying drawings.

FIG. 1 is a flowchart illustrating a method of fabricating a heterogeneous composite laminate according to one embodiment of the present disclosure;

FIG. 7C is an AFM height image illustrating graphene grown a on flat plane germanium (110) substrate according to Preparation Example 1-1;

FIG. 7D show AFM images for the bottom surface of each of the composite laminates one of which is prepared by a dry stacking process according to Example 1-1-1 and the other of which is prepared by a wet stacking process according to Comparative Example 2;

FIG. 11A is a schematic view of a stacked structure and expected band structure of a chiral composite laminate according to Example 3-1-1 and FIG. 11C illustrates ARPES data measured from crystals;

FIG. 11D illustrates ARPES data measured from crystals;

FIGS. 11E and 11F are diagrams illustrating the stacked structure of a chiral or achiral composite laminate with a plurality of twisted graphene layers;

Figure 13A:
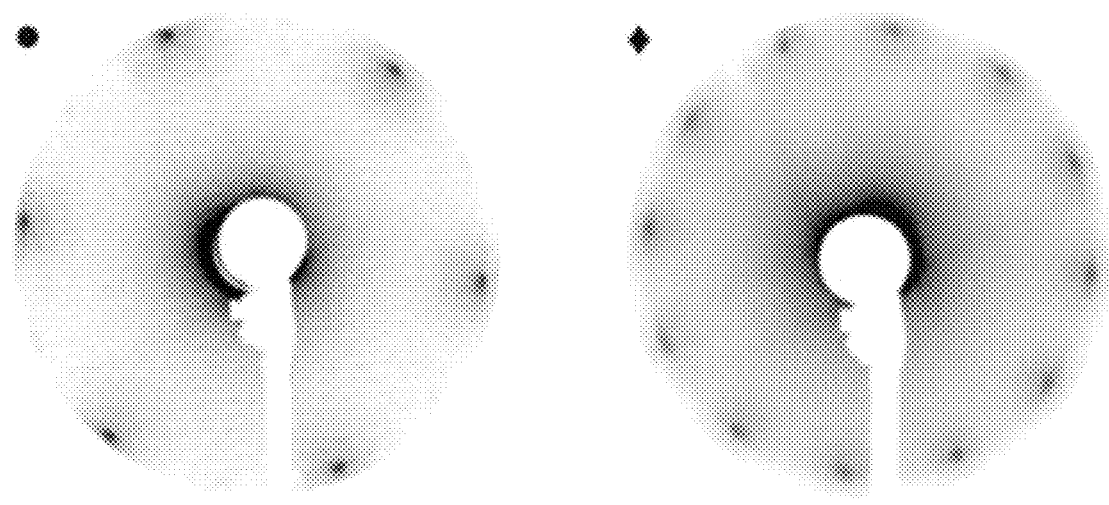
FIG. 13A is a diagram illustrating an LEED pattern for the case where graphene layers are aligned in one direction (0°)
Figure 13B:
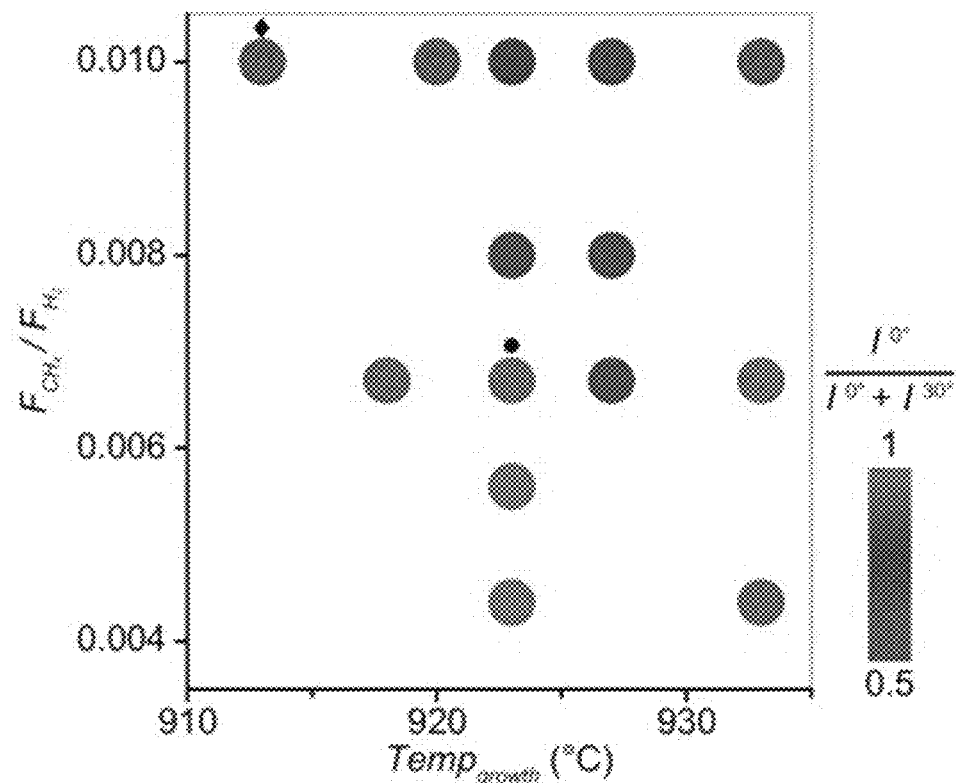
Figure 14A:
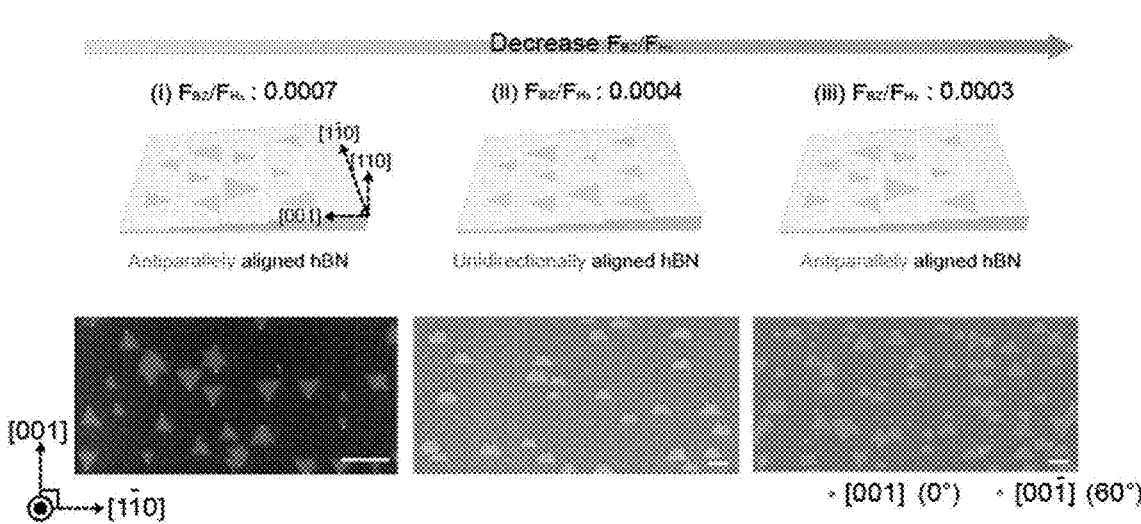
Figure 14B:
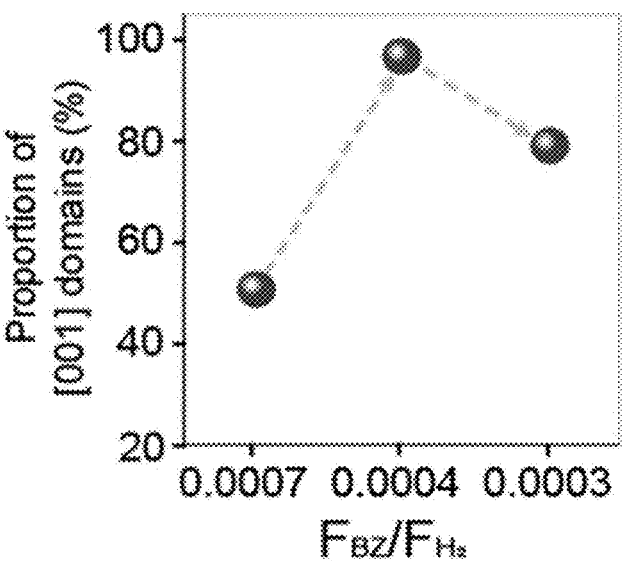
Figure 14C:
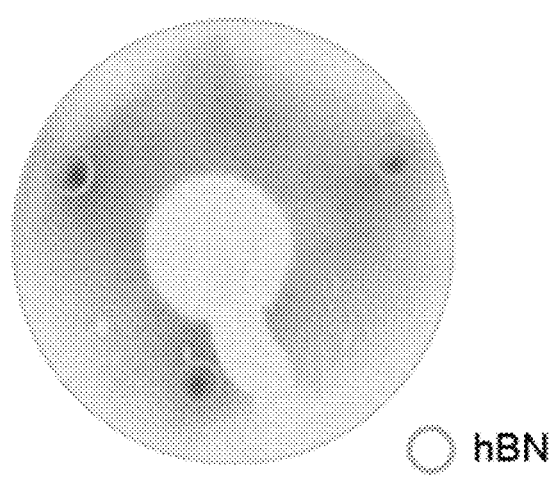
Figure 14D:
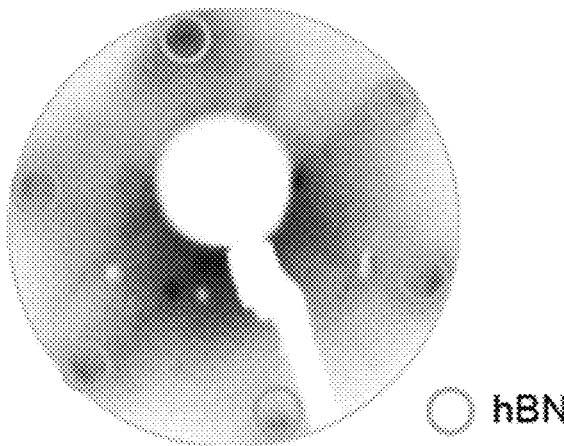

and an LEED pattern for the case where graphene layers are aligned in two directions (0° and 30°);

FIG. 13B is a diagram illustrating the alignment of graphene layers as a function of a partial pressure ratio of methane and hydrogen and a synthesis temperature;

FIGS. 14A and 14B illustrate data of synthesis of hexagonal boron nitride in two directions depending on partial pressure ratios;

FIG. 14C is a diagram illustrating an LEED pattern for the case where hexagonal boron nitride layers are aligned in one direction; and FIG. 14D is a diagram illustrating an LEED pattern for the case where hexagonal boron nitride layers are aligned in two directions.

DESCRIPTION OF THE PREFERRED EMBODIMENTS

Herein after, embodiments of the present disclosure will be described in detail with reference to the accompanying drawings in such a manner that the ordinarily skilled in the art can easily implement the embodiments of the present disclosure.

The description given below is not intended to limit the present disclosure to specific embodiments. In relation to describing the present disclosure, when the detailed description of the relevant known technology is determined to unnecessarily obscure the gist of the present disclosure, the detailed description may be omitted.

The terminology used herein is for the purpose of describing particular embodiments only and is not intended to limit the scope of the present disclosure. As used herein, the singular forms "a", "an", and "the" are intended to include the plural forms as well unless the context clearly indicates otherwise. It will be further understood that the terms "comprise" or "have" when used in this specification specify the presence of stated features, integers, steps, operations, elements and/or combinations thereof, but do not preclude the presence or addition of one or more other features, integers, steps, operations, elements, and/or combinations thereof.

Terms including ordinal numbers used in the specification, "first", "second", etc. can be used to discriminate one component from another component, but the order or priority of the components is not limited by the terms unless specifically stated. These terms are used only for the purpose of distinguishing one component from another component. For example, without departing from the scope of the present disclosure, a first component may be referred to as a second component, and a second component may be also referred to as a first component.

In addition, when it is mentioned that a component is "formed" or "stacked" on another component, it should be understood such that one component may be directly attached to or directly stacked on the front surface or one surface of the other component, or an additional component may be disposed between them.

Hereinafter, a composite laminate including graphene and hexagonal boron nitride layers stacked and arranged in two-dimensionally perpendicularly perpendicular direction to each other and a method of manufacturing the same, according to the present disclosure, will be described in detail. However, those are described as examples, and the present invention is not limited thereto and is only defined by the scope of the appended claims.

Figure 2:
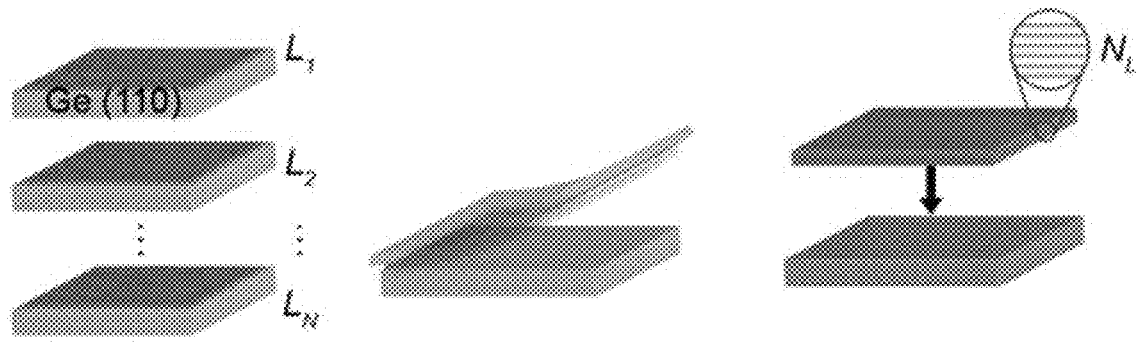
FIG. 2 is a diagram illustrating the sequence of processes for fabricating a heterogeneous composite laminate according to one embodiment of the present disclosure.

FIG. 2 is a diagram illustrating the processes of manu-facturing a heterogeneous composite laminate according to one embodiment of the present disclosure.

Figure 7A:
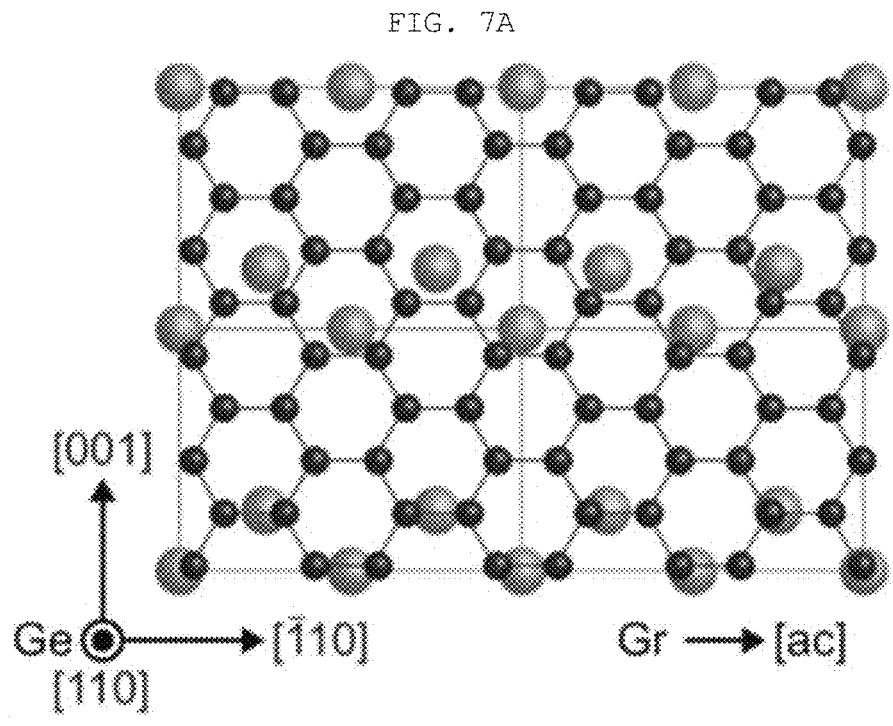
FIG. 7A is a schematic diagram illustrating the most energetically favorable atomic configuration of epitaxially grown graphene on a flat plane germanium (110) substrate according to Preparation Example 1-1.
Figure 7B:
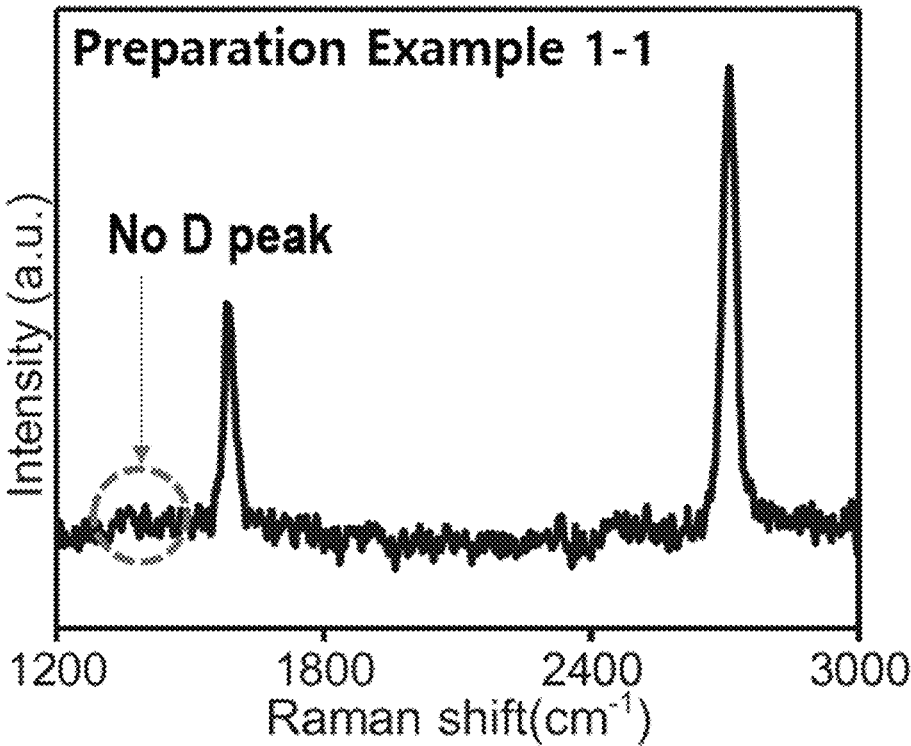
FIG. 7B is a Raman spectrum of monolayer graphene transferred onto a flat plane germanium (110) substrate according to Preparation Example 1-1.
Figure 7E:
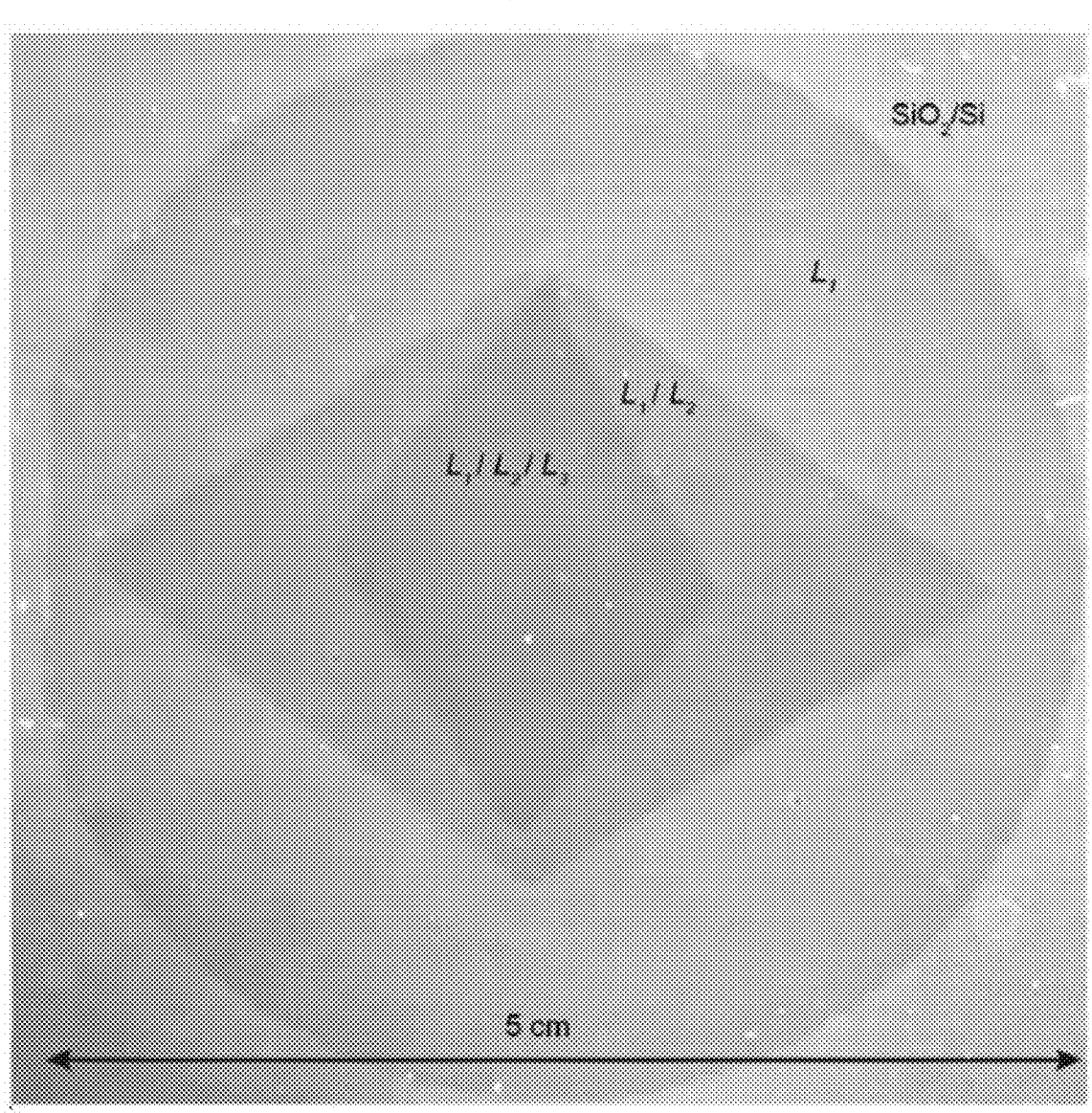
FIG. 7E is a photograph of a wafer-scale multilayer graphene according to one embodiment of the present disclosure.

FIG. 7E is a wafer-scale photograph of a multilayer graphene structure according to one embodiment of the present disclosure. $L_1$, $L_1/L_2$, and $L_1/L_2/L_3$ refer to wafer-scale composite laminates. Specifically, $L_1$ refers to a single-stack laminate, $L_1/L_2$ refers to a double-stack laminate, and $L_1/L_2/L_3$ refers triple-stack laminate.

A heterogeneous composite laminate according to one embodiment of the present disclosure will be described in detail with reference to FIGS. 2 and 7E.

The present disclosure provides a composite laminate including: a first layer comprising a first boron nitride layer comprising hexagonal boron nitride (hBN) or a first gra-phene layer comprising graphene; and a second layer posi-tioned on the first layer and including a second boron nitride layer containing hexagonal boron nitride (hBN) or a second graphene layer containing graphene.

In addition, each of the first layer and the second layer may be stacked in a direction perpendicular to an in-layer direction.

In addition, each of the first boron nitride layer, second boron nitride layer, first graphene layer, and second gra-phene layer may include an atomic monolayer or may include a plurality of atomic monolayers that are stacked perpendicular to the atomic monolayer by van der Waals attraction.

Herein, a two-dimensional (2D) layer refers to an atomic monolayer which is a single layer of atoms bonded by chemical bonds (for example, covalent bonds, ionic bonds, metallic bonds) along an in-layer direction, or refers to an atomic multilayer in which one atomic monolayer is stacked on another atomic monolayer by van der Waals attraction.

In addition, the first layer may include the first graphene layer containing graphene, and the second layer may include the second graphene layer containing graphene. In addition, the composite laminate may further include an n-th graphene layer containing graphene (wherein n is an integer in the range of from 3 to 20), in which the second graphene layer may be twisted at a first angle $\theta_1$ with respect to the first graphene layer in an in-layer direction, the n-th graphene layer may be twisted at an (n−1)-th angle $\theta_{(n-1)}$ with respect the (n−1)-th layer in the in-layer direction (wherein n is an integer in the range of from 3 to 20), and the first angle through the (n−1)-th angle may be angles in a clockwise direction and/or a counterclockwise.

In addition, the composite laminate may be an optical chiral member in which all of the first to (n−1)-th angles $\theta_1$ to $\theta_{(n-1)}$ are all angles in a clockwise direction or in a counterclockwise direction.

Since the second graphene layer is twisted at the first angle $\theta_1$ with respect to the first graphene layer in the in-layer direction, and the n-th graphene layer is twisted at the (n−1)-th angle $\theta_{(n-1)}$ with respect to the (n−1)-th gra-phene layer in the in-layer direction (where n is an integer in the range of from 3 to 20), the heterogeneous composite laminate of the present disclosure can be applied to various fields due to the unique band structure thereof.

In addition, the first layer may include the first boron nitride layer composed of an atomic monolayer of hBN, and the second layer may include the second graphene layer composed of an atomic monolayer of graphene.

In addition, graphite can be used instead of the graphene.

In addition, the composite laminate may further include a metal layer, the first layer may include a plurality of the first boron nitride layers each being composed of an atomic monolayer of hBN, the second layer includes the second graphene layer composed of an atomic monolayer of gra-phene, and the metal layer may be disposed on the first layer so as to be opposite to the second layer.

The metal layer may contain one or more metals selected from the group consisting of Au, Cu, Ni, and Al.

Figure 12A:
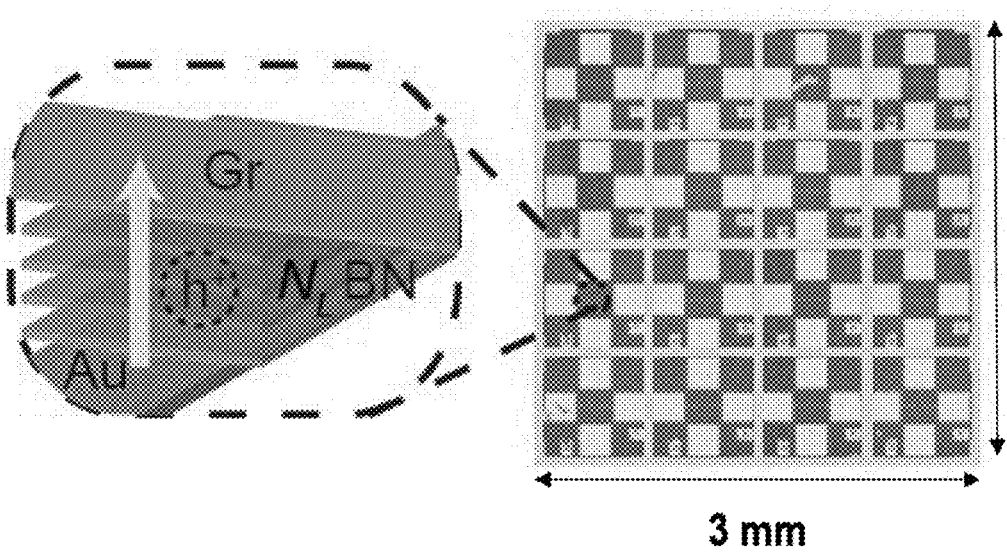
FIG. 12A illustrates a schematic diagram and an optical image of a tunnel device array including heterogeneous composite laminates according to one embodiment of the present disclosure.

FIG. 12A illustrates a schematic diagram and an optical image of a tunnel device array including heterogeneous composite laminates according to one embodiment of the present disclosure.

Referring to FIG. 12A, the composite laminate may be used for the fabrication of photodetectors, polarizing films, transistors, and tunnel devices.

The heterogeneous composite laminate of the present invention allows for the control of the twist angle and stacking order of each two-dimensional material layer. Therefore, laminates with novel properties can be obtained due to the interactions between the stacked two-dimensional materials. The unique band structure, programmable permit-tivity, ferroelectricity, and optical isomeric properties of the multilayer two-dimensional composite laminates can be used for optical polarization filters.

In addition, a multilayer two-dimensional material with a thickness that is controlled at the atomic level, preferably hexagonal boron nitride, can be used as an insulating layer for field effect transistors and tunnel devices.

In addition, ferroelectric properties created by forming a structure with no point symmetry obtained by controlling the stacking structure may be used to form insulating layers of semiconductor devices. In addition, the properties can be used to fabricate field effect transistors, tunnel devices, and photodetectors using the insulating layers.

According to a second aspect of the present disclosure, there is provided a vicinal plane germanium laminate includ-ing: a germanium (Ge) substrate with a vicinal plane (110) single crystalline surface; and a graphene layer or hexagonal boron nitride layer formed on the vicinal plane (110) single crystalline surface of the Ge substrate.

In addition, the vicinal plane germanium laminate may further include a metal layer, and the metal layer may be disposed on the graphene layer or hexagonal boron nitride layer so as to be opposite to the Ge substrate.

In addition, the vicinal plane (110) single crystalline surface of the Ge substrate may be formed by cutting a Ge substrate in <100> or <111> direction and then recrystal-lizing the resulting Ge substrate.

Additionally, single crystals of the graphene layer or hexagonal boron nitride layer may have the same orienta-tion.

FIG. 1 is a flowchart illustrating a method of fabricating a heterogeneous composite laminate according to the present disclosure.

FIG. 2 is a diagram illustrating the sequence of processes for fabricating a heterogeneous composite laminate accord-ing to one embodiment of the present disclosure.

Figure 4:
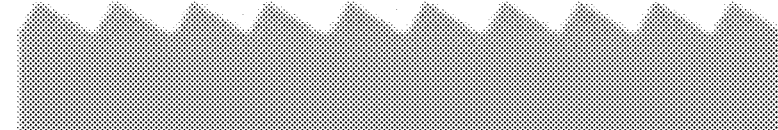
FIG. 4 is a diagram illustrating a germanium single crystal substrate with a vicinal plane, according to one embodiment of the present disclosure.

FIG. 4 is a diagram illustrating a vicinal plane germanium single crystal substrate according to one embodiment of the present disclosure.

FIG. 7A is a schematic diagram illustrating the most energetically favorable atomic configuration of epitaxially grown graphene on a flat plane germanium (110) substrate according to Preparation Example 1-1.

FIG. 7B is a Raman spectrum of monolayer graphene transferred onto a flat lane germanium (110) substrate according to Preparation Example 1-1.

FIG. 7C is an AFM height image illustrating graphene grown on a flat plane germanium (110) substrate according to Preparation Example 1-1.

Referring to FIGS. 1, 2, 4, 7A, 7B, and 7C, the present disclosure provides a method of fabricating a composite laminate, the method including: (a) forming a first layer including a first boron nitride layer containing hexagonal boron nitride (hBN) or a first graphene layer containing graphene on a first germanium (Ge) substrate; (b) forming a second layer including a second boron nitride layer containing hBN or a second graphene layer containing graphene on a second Ge substrate; (c) bringing a metal thin film of a release film coated with the metal thin film into contact with the first layer formed on the first Ge substrate, then mechanically exfoliating the first layer from the first Ge substrate, and transferring the first layer onto the metal thin film of the release film; and (d) bringing the first layer transferred to the metal thin film of the release film into the second film formed on the second Ge substrate, exfoliating the second layer from the second Ge substrate, and transferring the second layer onto the first layer, thereby producing the composite laminate in which the second layer is stacked on the first layer.

The mechanical exfoliation may be achieved by utilizing a difference in the Van der Waals attraction.

In addition, the van der Waals attraction between the metal film and the first layer may be stronger than the van der Waals attraction between the first layer and the first Ge substrate, and the van der Waals attraction between the first layer and the second layer may be stronger than the van der Waals attraction between the second layer and the second Ge substrate.

In addition, the metal of the metal thin film of step (c) may preferably be gold (Au). Several key properties of Au make it desirable to use Au as a support material. Since evaporated Au interacts weakly with graphene or hBN, the evaporated Au can be easily and completely removed after the transfer. In addition, a three-dimensional metal layer containing Au enables conformal contact with the substrate during assembly and final transfer, which is desirable for the assembly of high-yield composite laminates.

In addition, the composite laminate can be formed by vertical stacking.

In addition, graphite can be used instead of the graphene.

The Ge substrate may have a germanium (110) single crystalline surface or a germanium (110) single crystalline surface with a vicinal plane.

In addition, the vicinal plane (110) single crystalline surface of the Ge substrate may be formed by cutting a Ge substrate in <100> or <111> direction and then recrystallizing the resulting Ge substrate.

The formation of the first layer in step (a) or the formation of the second layer in step (b) may be performed by chemical vapor deposition (CVD).

In addition, steps (a) and (b) are carried out by chemical vapor deposition, the steps may be carried out at a temperature in a range of 700° C. to 938° C. and more preferably 850° C. to 938° C. When the temperature is below 700° C., the catalytic effect of the germanium substrate is insignificant, which makes it difficult to decompose the precursor, which is undesirable. When the temperature is higher than 938° C., the germanium substrate is melted, which is undesirable.

Furthermore, when steps (a) and (b) are carried out by chemical vapor deposition, the steps may be carried out at a pressure of 100 to 760 Torr and preferably at a pressure of 760 Torr. When the pressure is less than 100 Torr, sublimation of the surface of the germanium substrate is active, resulting in the formation of pits with nanometer to micrometer sizes on the surface, which increases the surface roughness and makes it difficult to form a film on the surface, which is undesirable.

In addition, when steps (a) and (b) are carried out by chemical vapor deposition, the steps may be carried out for a duration of 5 to 20 hours and more preferably for a duration of 10 to 15 hours. When the duration is shorter than 5 hours, the graphene or hexagonal boron nitride (hBN) grows in the form of flakes instead of a film, which is undesirable. When the duration is longer than 20 hours, a multilayer thin film is formed instead of a monolayer, which is undesirable.

When steps (a) and (b) are carried out by chemical vapor deposition, the partial pressure ratio of $CH_4$ to $H_2$ for the graphene synthesis may be in a range of 0.0067 to 0.0072 and may be preferably 0.007. When the partial pressure ratio is less than 0.0067 or greater than 0.0072, graphene is formed to have different in-plane crystal orientations, which is undesirable.

In the case of hexagonal boron nitride, the partial pressure ratio of Borazine (BZ) to $H_2$ gas may be in a range of 0.0003 to 0.0007 and may be preferably 0.0004. When the partial pressure ratio is less than 0.0003 or greater than 0.0007, hexagonal boron nitride is formed to have different in-plane crystal orientations, which is undesirable.

FIG. 7D shows AFM images for the bottom surface of each of the composite laminates one of which is prepared by a dry stacking process according to Example 1-1-1 and the other of which is prepared by a wet stacking process according to Comparative Example 2.

Referring to FIG. 7D, steps (a), (b), (c), and (d) may be performed in a dry condition. The present invention may use a Ge (110) single crystal substrate to mechanically exfoliate and assemble the formed two-dimensional material layer from the substrate without using a chemical solution. Since the two-dimensional material layer formed on the Ge (110) single crystal substrate has a weak bonding attraction with the substrate, the two-dimensional material layer can be mechanically exfoliated from the substrate without using an etching solution. Therefore, it is possible to obtain wafer-scale clean interfaces free of atomic-level impurities. The process described above can be used to form thin films that exhibit novel properties due to interactions between materials. The process described above can be applied to the fabrication of two-dimensional nanomaterials and nano-devices that use unique interactions between electrons, phonons, ions, etc.

Traditionally, large-area two-dimensional material layers containing graphene or hexagonal boron nitride have been synthesized on metal thin films or insulating substrates such as SiC. In order to exfoliate the two-dimensional material layers from the substrates and assemble the exfoliated two-dimensional material layers, it was essential to apply a polymer (e.g., PMMA) on the surface of the two-dimensional material layer by spin coating and then etch the substrate. Due to this etching process (wet process), the surface of the two-dimensional material is contaminated with the etching solution and polymer, and the contaminated surface weakens the interaction between the stacked two-dimensional materials, thereby hindering the obtainment of new properties governed by the crystal structure, thickness, and composition of the heterogeneous composite laminate. According to the present disclosure, a two-dimensional material layer can be mechanically exfoliated without using an etching solution. Therefore, the exfoliated two-dimensional material layer can be transferred onto the desired target substrate or thin film with pristine interfaces.

Additionally, steps (c) and (d) may be performed only once or multiple times each or in sequence. Since a composite laminate with the desired thickness can be formed by repeating the steps, the thickness of the composite laminate can be controlled at the atomic level.

In addition, when performing steps (c) and (d) each or in sequence once or multiple times, molecules, atoms, or ions may be intercalated into each two-dimensional layer, which may provide a heterogeneous composite laminate with novel properties due to their unique interactions with the two-dimensional materials.

Figure 3:
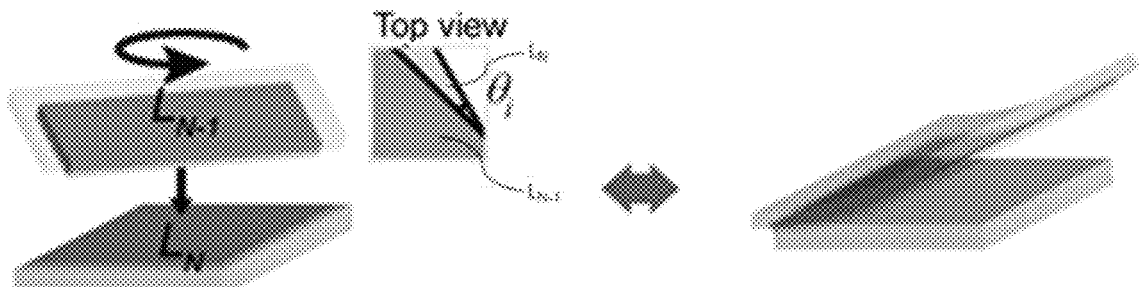
FIG. 3 is a schematic diagram illustrating an assembly of graphene layers each having a predetermined twist angle $\theta$ from another, according to one embodiment of the present disclosure.

FIG. 3 is a schematic diagram illustrating an assembly of graphene layers with a predetermined twist angle $\theta$ according to one embodiment of the present disclosure.

Figure 10A:
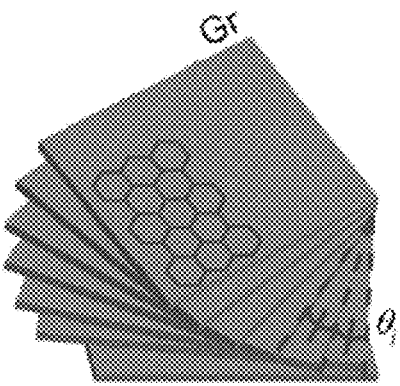
FIG. 10A is a schematic view of a chiral composite laminate according to Example 3-1-2.

FIG. 10A is a schematic diagram of a chiral composite laminate according to Examples 3-1-2.

Figure 11A:
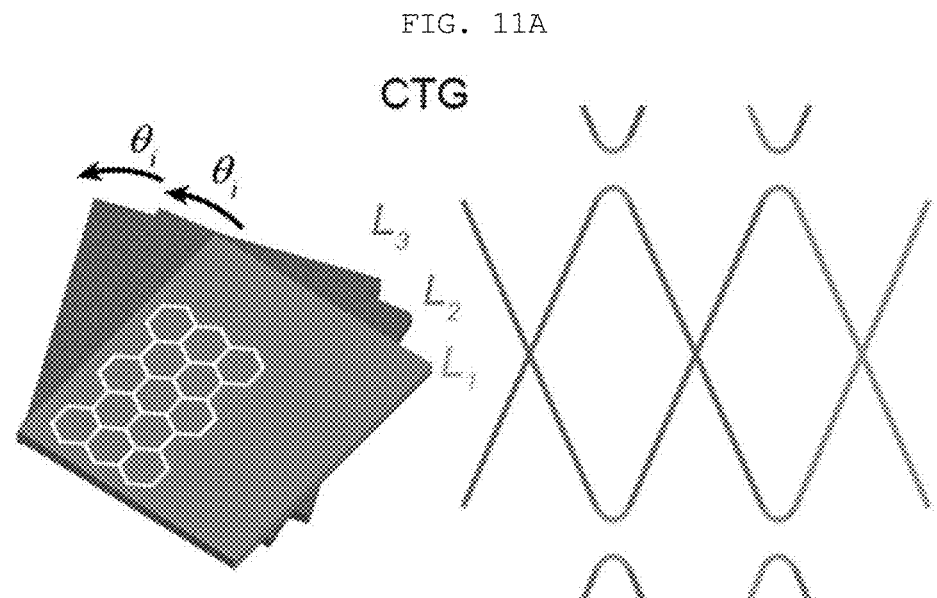

FIG. 11A is a schematic view of a stacked structure and expected band structure of a chiral composite laminate according to Example 3-1-1 and FIG. 11C illustrates ARPES data measured from crystals.

Figure 11B:
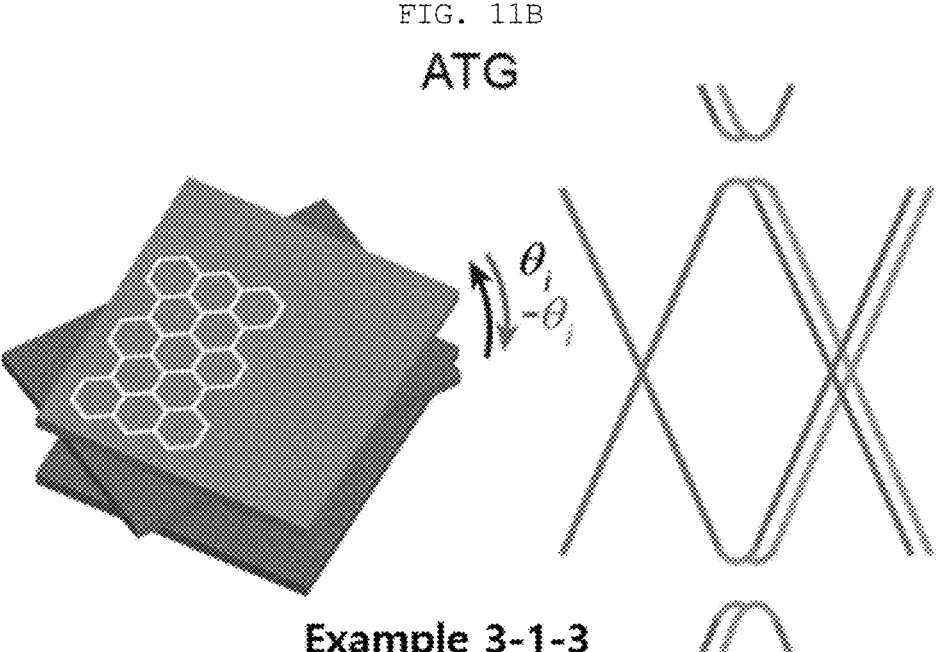
FIG. 11B is a schematic view of a stacked structure and expected band structure of an achiral composite laminate according to Example 3-1-3.

FIG. 11B is a schematic view of a stacked structure and expected band structure of an achiral composite laminate according to Example 3-1-3, and FIG. 11D illustrates ARPES data measured from crystals.

Figures 11E, 11F:
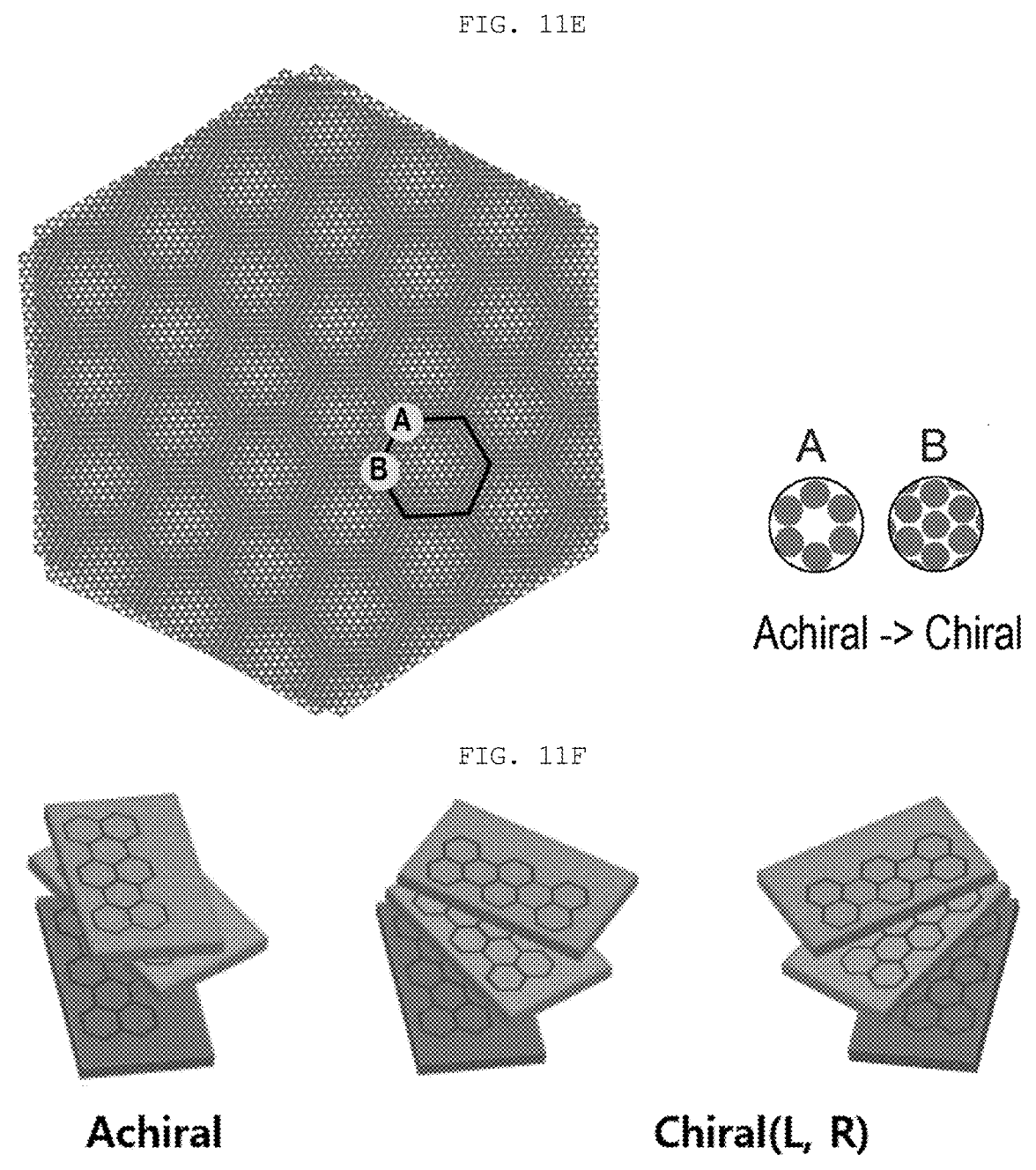

FIGS. 11E and 11F are diagrams illustrating the stacked structure of a chiral or achiral composite laminate with a plurality of twisting graphene layers.

Referring to FIGS. 3, 10A, and 11A through 11F, there is provided a method of fabricating a chiral or achiral composite laminate, the method including: (1) forming a first layer including a first graphene layer containing graphene on a first Ge substrate; (2) forming a second layer including a second graphene layer containing graphene on a second Ge substrate; (3) forming an n-th layer including an n-th graphene layer containing graphene on an n-th Ge substrate, wherein n is an integer in the range of from 3 to 20; (4) bringing a metal thin film of a release film coated with the metal thin film into contact with the first layer formed on the first Ge substrate, mechanically exfoliating the first layer from the first Ge substrate, and transferring the first layer onto the metal thin film of the release film; and (5) bringing the first layer transferred onto the metal thin film of the release film into contact with the second layer formed on the second Ge substrate, mechanically exfoliating the second layer from the second germanium substrate, and transferring the second layer onto the first layer; and (6) bringing the second layer transferred onto the first layer into contact with the n-th layer formed on the n-th Ge substrate, wherein n is an integer in the range of from 3 to 20, mechanically exfoliating the n-th layer from the n-th Ge substrate, and transferring the n-th layer onto the second layer to produce a composite laminate including the first layer, the second layer, . . . , the (n−1)-th layer, and the n-th layer.

The second graphene layer is twisted at a first angle $\theta_1$ with respect to the first graphene layer in an in-layer direction, the n-th graphene layer is twisted at an (n−1)-th angle $\theta_{(n-1)}$ with respect to the (n−1)-th graphene layer (where n is an integer in a range of from 3 to 20) in the in-layer direction, and the first angle trough the (n−1)-th angle may be angles in a clockwise direction and/or a counterclockwise direction.

The n-th graphene layer may be rotated by a predetermined angle $\theta$ in a direction parallel to the plane direction of the (n−1)-th graphene layer and then be stacked on the (n−1)-th graphene layer to form a plurality of laminates that are twisted. Therefore, the unique band structure of the composite laminate of the present disclosure can be applied to various fields.

In addition, the metal of the metal thin film of step (4) may preferably be gold (Au). Several key properties of Au make it desirable to use Au as a support material. Since evaporated Au interacts weakly with graphene or hBN, the evaporated Au can be easily and cleanly removed after the transfer. In addition, a three-dimensional metal layer containing Au enables conformal contact with the substrate during assembly and final transfer, which is desirable for the assembly of high-yield composite laminates.

Example

Hereinafter, the examples of the present invention will be described. However, the examples are for illustrative purposes, and the scope of the present invention is not limited by the examples.

Preparation Example 1: Growing Graphene Layer

Preparation Examples 1-1: Growing Graphene Layer ($N_L$=1) on Flat Plane Ge (110) Single Crystal Substrate Graphene was grown by CVD on a flat plane Ge (110) single crystal substrate AXT, ingot number: GH221 and Umicore, product number: 96462). First, the Ge substrate was sequentially sonicated in acetone and isopropyl alcohol each for 5 minutes to remove organic residues. The substrate was immersed in a 20% HF solution for 5 minutes to etch off natural oxides. After loading the substrate, a quartz tube furnace was evacuated to 100 mTorr and filled with Ar (200 sccm) and $H_2$ (20 sccm) to atmospheric pressure. Graphene was grown at 923° C. for 13.5 hours using $H_2$ (9 sccm), $CH_4$ (0.06 sccm), and Ar (300 sccm) to form a graphene layer.

Preparation Example 1-2: Growing Graphene Layer ($N_L$=1) on Vicinal Plane Ge (110) Single Crystal Substrate A graphene layer was formed in the same manner as in Preparation Example 1-1, except that graphene was grown on a vicinal plane Ge (110) single crystal substrate (pam-Xiamen, PAMP21040-GE) instead of the flat plane Ge (110) single crystal substrate (AXT, ingot number: GH221 and Umicore, product number: 96462).

Preparation Example 2: Growing Hexagonal Boron Nitride Layer

Preparation Example 2-1: Growing Hexagonal Boron Nitride Layer ($N_L$=1) on Flat Plane Ge (110) Single Crystal Substrate A hexagonal boron nitride layer was formed in the same manner as in Preparation Example 1-1, except that hexagonal boron nitride (hBN) was grown instead of graphene.

Here, the hBN layer was grown by CVD on the Ge (110) single crystal substrate. After loading the substrate, the furnace was evacuated and then filled with $H_2$ (200 sccm) to atmospheric pressure. The hBN layer was grown at 926° C. for 17 hours with borazine (stored at −20° C.) carried by $H_2$ (200 sccm) and Ar (0.0003 sccm).

Preparation Example 2-2: Growing Hexagonal Boron Nitride Layer ($N_L$=1) on Vicinal Plane Ge (110) Single Crystal Substrate A hexagonal boron nitride layer was formed in the same manner as in Preparation Example 1-2, except that hexagonal boron nitride (hBN) was grown instead of graphene.

Here, the hBN layer was grown by CVD on the Ge (110) single crystal substrate. After loading the substrate, the furnace was evacuated and then filled with $H_2$ (200 sccm) to atmospheric pressure. The hBN layer was grown at 926° C. for 17 hours with borazine (stored at –20° C.) carried by $H_2$ (200 sccm) and Ar (0.0003 sccm).

Example 1: Vertical Assembly of Composite Laminate with Graphene Layer

Example 1-1: Vertical Assembly of Composite Laminate Including Graphene Layer Grown on Flat Plane Ge (110) Single Crystal Substrate Example 1-1-1: Composite Laminate with Graphene Layer, $N_L$-2

A 40 nm-thick metal layer made of Au was deposited by thermal vapor deposition on the graphene/Ge (110) substrate formed in Preparation Example 1-1. Polymethyl methacrylate (PMMA, 996K, 8% in anisole) was spin-coated onto the Au metal layer for 1 minute at 2000 rpm and then heated at 180° C. for 10 minutes. To mechanically exfoliate the PMMA/Au/graphene multilayer structure provided on the Ge (110) substrate, a thermal release tape (TRT) (Nitto, product number: 3195M) was attached to the surface of the structure with a handling frame, and then the graphene layer on the substrate was mechanically exfoliated from the substrate. The exfoliated structure was mechanically transferred onto the target surface having a graphene layer, followed by baking at 145° C. to release the TRI, and the remaining composite laminate was annealed at 180° C. The PMMA layer was removed by immersing the substrate in chloroform for 4 hours or baking at 315° C. for 3 hours, followed by $O_2$ plasma treatment for 2 minutes to remove residue. The Au thin film was etched with $KI/I_2$ solution, and the surface was rinsed with ethanol and deionized water (DI) to prepare a vertical composite laminate with a clean interface on a flat surface.

Example 1-1-2: Composite Laminate with Graphene Layer, $N_L$=3

A composite laminate was fabricated in the same manner as in Example 1-1-1, except that the exfoliation and transfer were repeated twice.

Example 1-1-3: Composite Laminate with Graphene Layer, $N_L$=4

A composite laminate was fabricated in the same manner as in Example 1-1-1, except that the exfoliation and transfer were repeated three times.

Example 1-1-4: Composite Laminate with Graphene Layer, $N_L$=5

A composite laminate was fabricated in the same manner as in Example 1-1-1, except that the exfoliation and transfer were repeated four times.

Example 1-1-5: Composite Laminate with Graphene Layer, $N_L$=10

A composite laminate was fabricated in the same manner as in Example 1-1-1, except that the exfoliation and transfer were repeated nine times.

Example 1-2: Vertical Assembly of Composite Laminate Including Graphene Layer Grown on Vicinal Plane Ge (110) Single Crystal Substrate Example 1-2-1: Composite Laminate with Graphene Layer, $N_L$=2

A 40 nm-thick metal layer made of Au was deposited by thermal vapor deposition on the graphene/Ge (110) substrate formed in Preparation Example 1-2. Polymethyl methacrylate (PMMA, 996K, 8% in anisole) was spin-coated onto the Au metal layer for 1 minute at 2000 rpm and then heated at 180° C. for 10 minutes. To mechanically exfoliate the PMMA/Au/graphene multilayer structure provided on the Ge (110) substrate, a thermal release tape (TRT) (Nitto, product number: 3195M) was attached to the surface with a handling frame, and then the graphene layer on the substrate was mechanically exfoliated from the substrate. The exfoliated structure was mechanically transferred onto the target surface having a graphene layer, followed by baking at 145° C. to release the TRI, and the remaining composite laminate was annealed at 180° C. The PMMA layer was removed by immersing the substrate in chloroform for 4 hours or baking at 315° C. for 3 hours, followed by $O_2$ plasma treatment for 2 minutes to remove the residues. The Au thin film was etched with $KI/I_2$ solution, and the surface was rinsed with ethanol and deionized water (DI) to prepare a vertical composite laminate with a clean interface.

Example 1-2-2: Composite Laminate with Graphene Layer, $N_L$=3

A composite laminate was fabricated in the same manner as in Example 1-2-1, except that the exfoliation and transfer were repeated twice.

Example 1-2-3: Composite Laminate with Graphene Layer, $N_L$=4

A composite laminate was fabricated in the same manner as in Example 1-2-1, except that the exfoliation and transfer were repeated three times.

Example 1-2-4: Composite Laminate with Graphene Layer, $N_L$=5

A composite laminate was fabricated in the same manner as in Example 1-2-1, except that the exfoliation and transfer were repeated four times.

Example 1-2-5: Composite Laminate with Graphene Layer, $N_L$=10

A composite laminate was fabricated in the same manner as in Example 1-2-1, except that the exfoliation and transfer were repeated nine times.

Example 2: Vertical Assembly of Composite Laminate Containing Hexagonal Boron Nitride (hBN) Layer

Example 2-1: Vertical Assembly of Composite Laminate Including hBN Layer Grown on Flat Plane Ge (110) Single Crystal Substrate

Example 2-1-1: Composite Laminate with Hexagonal Boron Nitride (hBN) Layer, $N_L$=2

A 40 nm-thick metal layer made of Au was deposited by thermal vapor deposition on the hexagonal boron nitride/Ge (110) substrate formed in Preparation Example 2-1. Polymethyl methacrylate (PMMA, 996K, 8% in anisole) was spin-coated onto the Au metal layer for 1 minute at 2000 rpm and then heated at 180° C. for 10 minutes. To mechanically exfoliate the PMMA/Au/hBN multilayer structure provided on the Ge (110) substrate, a thermal release tape (TRT) (Nitto, product number: 3195M) was attached to the surface of the structure with a handling frame, and then the hBN layer on the substrate was mechanically exfoliated from the substrate. The exfoliated structure was mechanically transferred onto the target surface having an hBN layer, followed by baking at 145° C. to release the TRT, and the remaining composite laminate was annealed at 180° C. The PMMA layer was removed by immersing the substrate in chloroform for 4 hours or baking at 315° C. for 3 hours, followed by $O_2$ plasma treatment for 2 minutes to remove the residue. The Au thin film was etched with $KI/I_2$ solution, and the surface was rinsed with ethanol and deionized water (DI) to prepare a vertical composite laminate with a clean interface.

Example 2-1-2: Composite Laminate with Hexagonal Boron Nitride (hBN) Layer, $N_L$=3

A composite laminate was fabricated in the same manner as in Example 2-1-1, except that the exfoliation and transfer were repeated twice.

Example 2-1-3: Composite Laminate with Hexagonal Boron Nitride (hBN) Layer, $N_L$=4

A composite laminate was fabricated in the same manner as in Example 2-1-1, except that the exfoliation and transfer were repeated three times.

Example 2-1-4: Composite Laminate with Hexagonal Boron Nitride (hBN) Layer, $N_L$=5

A composite laminate was fabricated in the same manner as in Example 2-1-1, except that the exfoliation and transfer were repeated four times.

Example 2-2: Vertical Assembly of Composite Laminate Including hBN Layer Grown on Vicinal Plane Ge (110) Single Crystal Substrate

Example 2-2-1: $N_L$=2, Composite Laminate with Hexagonal Boron Nitride (hBN) Layer A 40 nm-thick metal layer made of Au was deposited by thermal vapor deposition on the hexagonal boron nitride/Ge (110) substrate formed in Preparation Example 2-2. Polymethyl methacrylate (PMMA, 996K, 8% in anisole) was spin-coated onto the Au metal layer for 1 minute at 2000 rpm and then heated at 180° ° C. for 10 minutes. To mechanically exfoliate the PMMA/Au/hBN multilayer structure provided on the Ge (110) substrate, a thermal release tape (TRT) (Nitto, product number: 3195M) was attached to the surface of the structure with a handling frame, and then the hBN layer on the substrate was mechanically exfoliated from the substrate. The exfoliated structure was mechanically transferred onto the target surface having an hBN layer, followed by baking at 145° C. to release the TRT, and the remaining composite laminate was annealed at 180° C. The PMMA layer was removed by immersing the substrate in chloroform for 4 hours or baking at 315° C. for 3 hours, followed by $O_2$ plasma treatment for 2 minutes to remove the residue. The Au thin film was etched with $KI/I_2$ solution, and the surface was rinsed with ethanol and deionized water (DI) to prepare a vertical composite laminate with a clean interface.

Example 2-2-2: Composite Laminate with Hexagonal Boron Nitride (hBN) Layer, $N_L$=3

A composite laminate was fabricated in the same manner as in Example 2-2-1, except that the exfoliation and transfer were repeated twice.

Example 2-2-3: Composite Laminate with Hexagonal Boron Nitride (hBN) Layer, $N_L$=4

A composite laminate was fabricated in the same manner as in Example 2-2-1, except that the exfoliation and transfer were repeated three times.

Example 2-2-4: Composite Laminate with Hexagonal Boron Nitride (hBN) Layer, $N_L$=5

A composite laminate was fabricated in the same manner as in Example 2-2-1, except that the exfoliation and transfer were repeated four times.

Example 3: Composite Laminate Formed with Control of Twist Angle

Example 3-1: Composite Laminate Stacked on Top of Graphene Layer Grown on Flat Plane Ge (110) Single Crystal Substrate with Control of Twist Angle

Example 3-1-1: Chiral Composite Laminate, $N_L$=3, $\theta$=20°

A chiral composite laminate was fabricated in the same manner as in Example 1-1-1, except that when repeating the exfoliation and transfer twice, the exfoliated structure was stacked after twisting at an angle of 20° in a direction parallel to the plane direction of the target surface each time the exfoliated structure was stacked.

Here, the in-plane angle θ was controlled using a custom-built transmission system equipped with a rotating stage and an optical microscope. The Ge (110) substrate on which graphene was grown was placed on the stage and heated to 80° C. The Ge substrate was mounted on a micromanipulator, with the graphene surface to be transferred facing down. The in-plane direction angle θ was controlled by optically checking the rotation angle between the straight edges of the stacked graphene layers.

Example 3-1-2: Chiral Composite Laminate, $N_L$=10, $\theta$=20°

A chiral composite laminate was fabricated in the same manner as in Example 1-1-1, except that when repeating the exfoliation and transfer a total of nine times, the exfoliated structure was stacked after twisting at an angle of 20° in a direction parallel to the plane direction of the target surface each time that the exfoliated structure was stacked.

Example 3-1-3: Achiral Composite Laminate, $N_L=3$, $\theta_1$-20°, $\theta_2=-20$°

An achiral composite laminate was fabricated in the same manner as in Example 1-1-1, except that when repeating the exfoliation and transfer, the first time of stacking was performed with a rotation angle of 20° in a direction parallel to the plane direction of the target surface, and the second time of stacking was performed with a rotation angle of –20° C.

Example 3-1-4: Chiral Composite Laminate, $N_L=6$, $\theta=10$°

A chiral composite laminate was fabricated in the same manner as in Example 1-1-1, except that when repeating the exfoliation and transfer a total of five times, the exfoliated structure was stacked after twisting at an angle of 10° in a direction parallel to the plane direction of the target surface each time that the exfoliated structure was stacked.

Example 3-2: Composite Laminate Stacked on Top of Graphene Layer Grown on Vicinal Plane Ge (110) Single Crystal Substrate with Control of Twist Angle

Example 3-2-1: Chiral Composite Laminate, $N_L=3$, $\theta=20$°

A chiral composite laminate was fabricated in the same manner as in Example 1-2-1, except that when repeating the exfoliation and transfer a total of two times, the exfoliated structure was stacked after twisting at an angle of 20° in a direction parallel to the plane direction of the target surface each time that the exfoliated structure was stacked.

Here, the in-plane angle θ was controlled using a custom-built transmission system equipped with a rotating stage and an optical microscope. The Ge (110) substrate on which graphene was grown was placed on the stage and heated to 80° C. The Ge substrate was mounted on a micromanipulator, with the graphene surface to be transferred facing down. The in-plane direction angle θ was controlled by optically checking the rotation angle between the straight edges of the stacked graphene layers.

Example 3-2-2: Chiral Composite Laminate, $N_L=10$, $\theta=20$°

A chiral composite laminate was fabricated in the same manner as in Example 1-2-1, except that when repeating the exfoliation and transfer a total of nine times, the exfoliated structure was stacked after twisting at an angle of 20° in a direction parallel to the plane direction of the target surface each time that the exfoliated structure was stacked.

Example 3-2-3: Achiral Composite Laminate, $N_L=3$, $\theta_1$-20°, $\theta_2=-20$°

An achiral composite laminate was fabricated in the same manner as in Example 1-2-1, except that when repeating the exfoliation and transfer, the first time of stacking was performed with a rotation angle of 20° in a direction parallel to the plane direction of the target surface, and the second time of stacking was performed with a rotation angle of –20° C.

Example 4: Heterogeneous Composite Laminate with Graphene/hBN Layer, $N_L=5$

Example 4-1: Heterogeneous Composite Laminate Including Graphene/hBN Layer Stacked on Top of Graphene Layer Grown on Flat Plane Ge (110) Single Crystal Substrate A graphene/hBN heterogeneous composite laminate was fabricated in the same manner as in Example 1-1-1, except that the hBN layer was transferred onto the target surface with graphene to form a graphene-hBN composite layer, the process was repeated once more to form a graphene-hBN-graphene-hBN composite layer, and the composite layer was transferred onto the graphene layer formed in Preparation Example 1-1.

Example 4-2: Heterogeneous Composite Laminate Including Graphene/hBN Layer Stacked on Top of Graphene Layer Grown on Vicinal Plane Ge (110) Single Crystal Substrate A graphene/hBN heterogeneous composite laminate was fabricated in the same manner as in Example 1-2-1, except that the hBN layer was transferred onto the target surface with graphene to form a graphene-hBN composite layer, the process was repeated to form a graphene-hBN-graphene-hBN composite layer, and the composite layer was transferred onto the graphene layer formed in Preparation Example 1-2.

Example 5: Fabrication of Composite Laminates with Different Metal Layers

Example 5-1: Deposition of Cu Metal Layer

A composite laminate was fabricated in the same manner as in Example 1-1-1, except that a Cu metal layer was deposited instead of the 40 nm-thick Au metal layer.

Example 5-2: Deposition of Al Metal Layer

A composite laminate was fabricated in the same manner as in Example 1-1-1, except that an Al metal layer was deposited instead of the 40 nm-thick Au metal layer.

Example 5-3: Deposition of Ni Metal Layer

A composite laminate was fabricated in the same manner as in Example 1-1-1, except that a Ni metal layer was deposited instead of the 40 nm-thick Au metal layer.

Comparative Example 1: Composite Laminate ($N_L=2$) Including Graphene Grown on Copper Substrate A composite laminate was fabricated in the same manner as in Example 1-2-1, except that a copper substrate was used instead of the vicinal plane Ge (110) single crystal substrate.

Comparative Example 2: Composite Laminate ($N_L=2$) Fabricated by Electrochemical Exfoliation (Wet Process)

A composite laminate was fabricated in the same manner as in Example 1-1-1, except that electrochemical exfoliation was used instead of the mechanical exfoliation. Here, the electrochemical exfoliation was performed as described below. PMMA was spin-coated onto a Ge (110) substrate with a grown graphene layer is grown and was then baked at 180° C. for 10 minutes. The PMMA/graphene laminate was immersed in a 1 M NaOH aqueous solution and an electric current of 0.1 A is applied across the Ge anode and the PMMA/graphene/Ge cathode to generate $H_2$ bubbles at the interface between the graphene and the Ge substrate. As a result, the PMMA/graphene laminate was exfoliated from the Ge substrate. The composite laminate was rinsed five times with deionized water and then transferred to the target surface with a grown graphene layer.

Table 1 below summarizes the composite laminates according to Preparation Examples 1-1 to 2-2, Examples 1-1-1 to 5-3, and Comparative Examples 1 and 2.

TABLE 1

| Classification | 2D material | Substrate | Number of layers | Rotation angle (°) $\theta_1$ | Rotation angle (°) $\theta_2$ | Metal layer | Exfoliation process |
|---|---|---|---|---|---|---|---|
| Preparation Example 1-1 | Graphene | Flat plane Ge(110) | 1 | 0 | 0 | — | — |
| Preparation Example 1-2 | Graphene | Vicinal plane Ge(110) | 1 | 0 | 0 | — | — |
| Preparation Example 2-1 | hBN | Flat plane Ge(110) | 1 | 0 | 0 | — | — |
| Preparation Example 2-2 | hBN | Vicinal plane Ge(110) | 1 | 0 | 0 | — | — |
| Example 1-1-1 | Graphene | Flat plane Ge(110) | 2 | 0 | 0 | Au | Mechanical |
| Example 1-1-2 | Graphene | Flat plane Ge(110) | 3 | 0 | 0 | Au | Mechanical |
| Example 1-1-3 | Graphene | Flat plane Ge(110) | 4 | 0 | 0 | Au | Mechanical |
| Example 1-1-4 | Graphene | Flat plane Ge(110) | 5 | 0 | 0 | Au | Mechanical |
| Example 1-1-5 | Graphene | Flat plane Ge(110) | 10 | 0 | 0 | Au | Mechanical |
| Example 1-2-1 | Graphene | Vicinal plane Ge(110) | 2 | 0 | 0 | Au | Mechanical |
| Example 1-2-2 | Graphene | Vicinal plane Ge(110) | 3 | 0 | 0 | Au | Mechanical |
| Example 1-2-3 | Graphene | Vicinal plane Ge(110) | 4 | 0 | 0 | Au | Mechanical |
| Example 1-2-4 | Graphene | Vicinal plane Ge(110) | 5 | 0 | 0 | Au | Mechanical |
| Example 1-2-5 | Graphene | Vicinal plane Ge(110) | 10 | 0 | 0 | Au | Mechanical |
| Example 2-1-1 | hBN | Flat plane Ge(110) | 2 | 0 | 0 | Au | Mechanical |
| Example 2-1-2 | hBN | Flat plane Ge(110) | 3 | 0 | 0 | Au | Mechanical |
| Example 2-1-3 | hBN | Flat plane Ge(110) | 4 | 0 | 0 | Au | Mechanical |
| Example 2-1-4 | hBN | Flat plane Ge(110) | 5 | 0 | 0 | Au | Mechanical |
| Example 2-2-1 | hBN | Vicinal plane Ge(110) | 2 | 0 | 0 | Au | Mechanical |
| Example 2-2-2 | hBN | Vicinal plane Ge(110) | 3 | 0 | 0 | Au | Mechanical |
| Example 2-2-3 | hBN | Vicinal plane Ge(110) | 4 | 0 | 0 | Au | Mechanical |
| Example 2-2-4 | hBN | Vicinal plane Ge(110) | 5 | 0 | 0 | Au | Mechanical |
| Example 3-1-1 | Graphene | Flat plane Ge(110) | 3 | 20 | 20 | Au | Mechanical |
| Example 3-1-2 | Graphene | Flat plane Ge(110) | 10 | 20 | 20 | Au | Mechanical |
| Example 3-1-3 | Graphene | Flat plane Ge(110) | 3 | 20 | −20 | Au | Mechanical |
| Example 3-1-4 | Graphene | Flat plane Ge(110) | 6 | 10 | 10 | Au | Mechanical |

TABLE 1-continued

| Classification | 2D material | Substrate | Number of layers | Rotation angle (°) $\theta_1$ | $\theta_2$ | Metal layer | Exfoliation process |
|---|---|---|---|---|---|---|---|
| Example 3-2-1 | Graphene | Vicinal plane Ge(110) | 3 | 20 | 20 | Au | Mechanical |
| Example 3-2-2 | Graphene | Vicinal plane Ge(110) | 10 | 20 | 20 | Au | Mechanical |
| Example 3-2-3 | Graphene | Vicinal plane Ge(110) | 3 | 20 | −20 | Au | Mechanical |
| Example 4-1 | Graphene/hBN | Flat plane Ge(110) | 5 | 0 | 0 | Au | Mechanical |
| Example 4-2 | Graphene/hBN | Vicinal plane Ge(110) | 5 | 0 | 0 | Au | Mechanical |
| Example 5-1 | Graphene | Flat plane Ge(110) | 2 | 0 | 0 | Cu | Mechanical |
| Example 5-2 | Graphene | Flat plane Ge(110) | 2 | 0 | 0 | Al | Mechanical |
| Example 5-3 | Graphene | Flat plane Ge(110) | 2 | 0 | 0 | Ni | Mechanical |
| Comparative Example 1 | Graphene | Copper | 2 | 0 | 0 | Au | Mechanical |
| Comparative Example 2 | Graphene | Flat plane Ge(110) | 2 | 0 | 0 | Au | Electrochemical |

Experimental Example

Figure 5A:
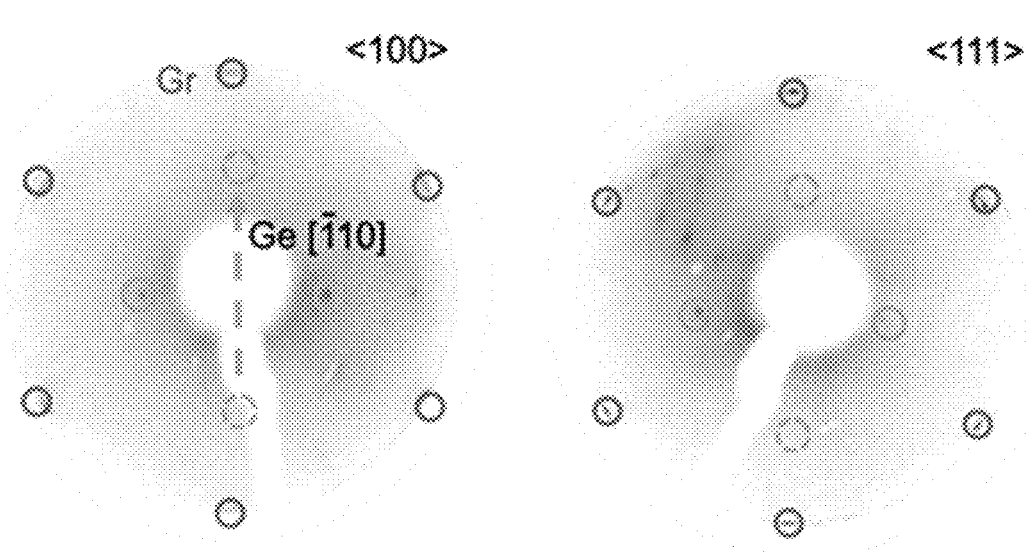
FIG. 5A is a diagram illustrating LEED patterns of graphene layers synthesized on vicinal plane germanium substrates cut in <100> and <111> directions according to Preparation Example 1-2.
Figure 5B:
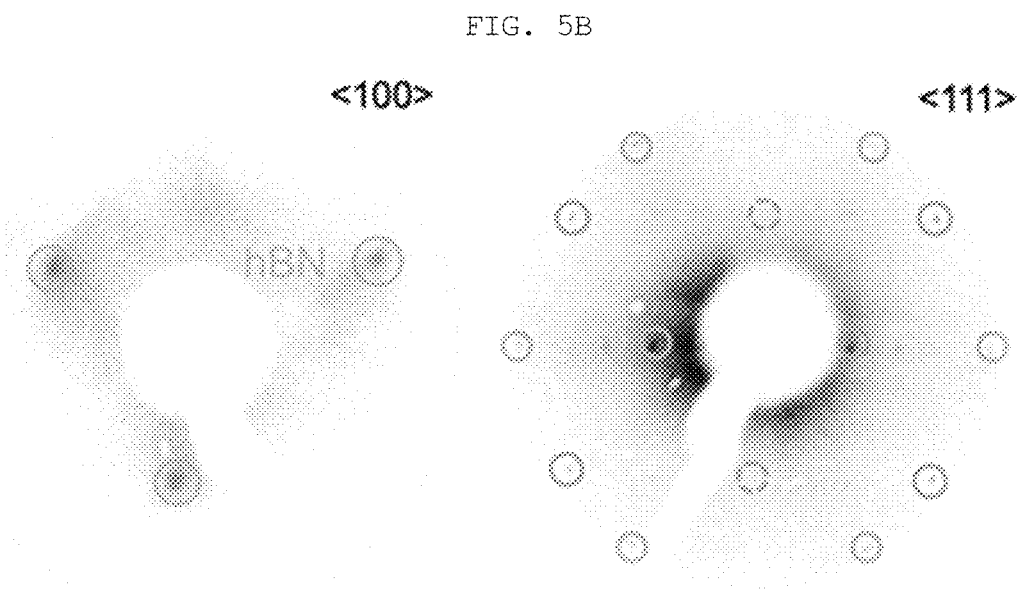
FIG. 5B is a diagram illustrating LEED patterns of hexagonal boron nitride layers synthesized on vicinal plane germanium substrates cut in <100> and <111> directions according to Preparation Example 2-2.
Figure 6A:
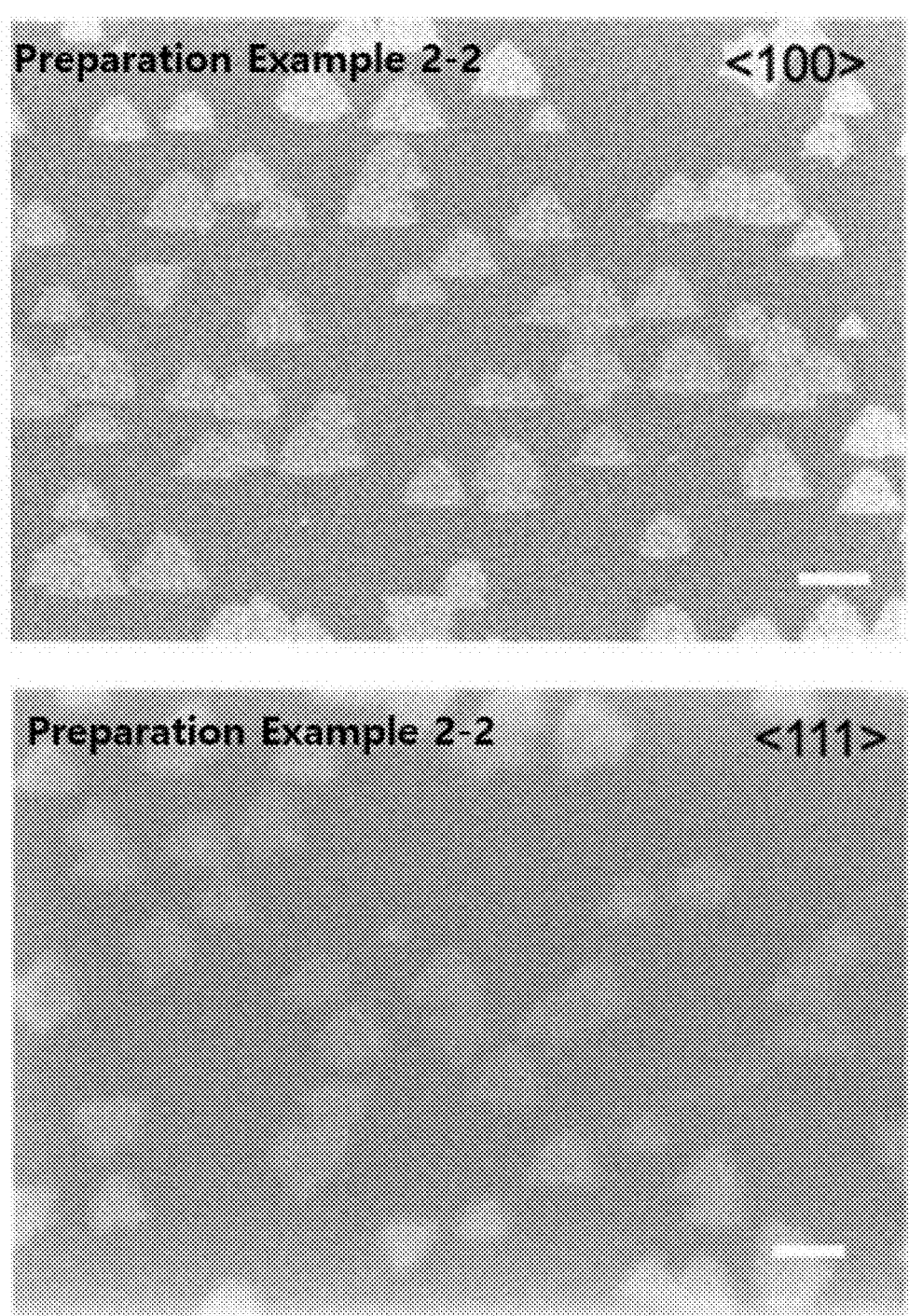
FIG. 6A is a diagram illustrating SEM images of hexagonal boron nitride layers synthesized on vicinal plane germanium substrates cut in <100> and <111> directions according to Preparation Example 2-2.
Figure 6B:
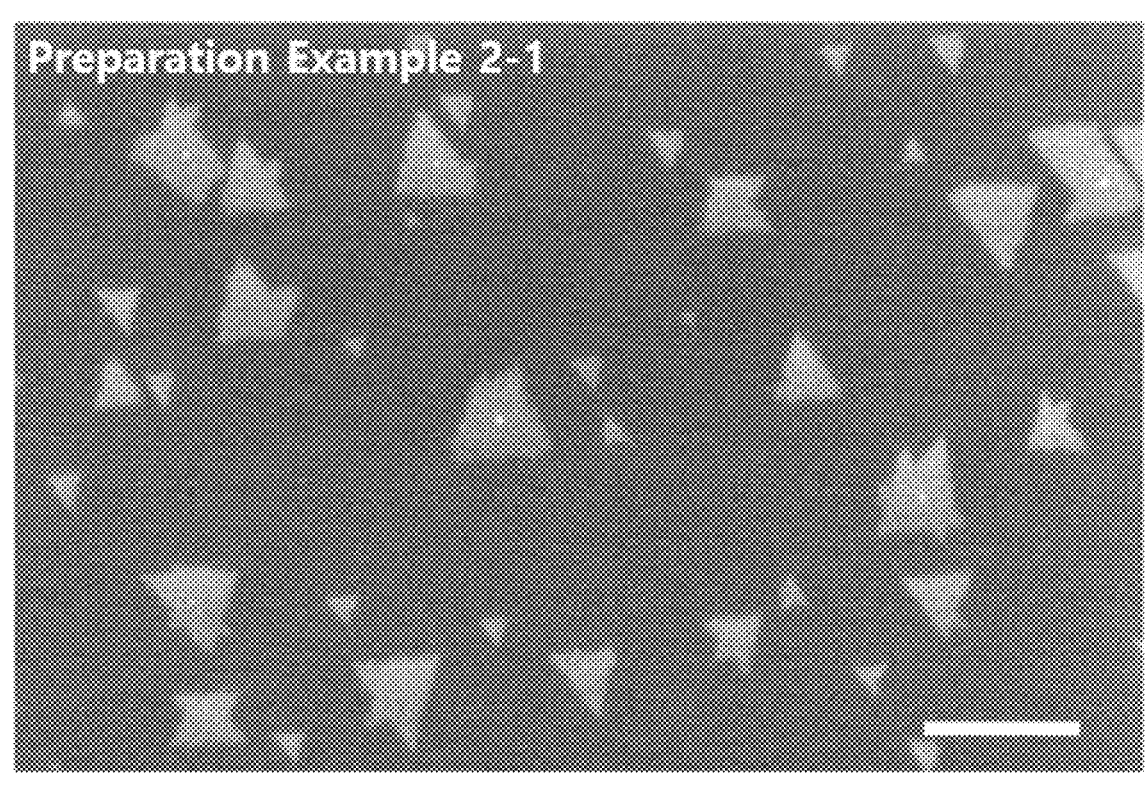
FIG. 6B is a diagram illustrating an SEM image of a hexagonal boron nitride layer synthesized on a flat plane germanium (110) substrate according to Preparation Example 2-1.

Experimental Example 1: Identification of 2D
Material Layers Synthesized on Vicinal Plane Ge
(110) Substrate FIG. 4 is a diagram of a vicinal plane Ge single crystal substrate according to one embodiment of present the disclosure. FIG. 5A is a diagram illustrating LEED patterns of graphene synthesized on vicinal plane Ge substrates cut in <100> and <111> directions according to Preparation Example 1-2. FIG. 5B is a diagram illustrating LEED patterns of hexagonal boron nitride synthesized on vicinal plane Ge substrates cut in <100> and <111> directions according to Preparation Example 2-2. FIG. 6A is a diagram illustrating LEED patterns of hexagonal boron nitride synthesized on vicinal plane Ge substrates cut in <100> and <111> directions according to Preparation Example 2-2. FIG. 6B is a diagram illustrating an SEM image of hexagonal boron nitride synthesized on a flat plane Ge (110) substrate according to Preparation Example 2-1.

Referring to FIGS. 4, 5A, and 6A, it can be seen that the graphene and hBN synthesized on the vicinal plane Ge (110) substrates exhibit 99% or greater uniformity and a low level of atomic defects, as determined by low-energy electron diffraction.

Referring to FIG. 5B, the data shows that when the Ge substrate is mistakenly cut in <100> direction and then hexagonal boron nitride is synthesized, the hexagonal boron nitride grows in one direction (3-fold symmetry, 3 dots), and when the substrate is mistakenly cut in <111> direction, the hexagonal boron nitride grows in two directions (6-fold symmetry, 6 dots).

Referring to FIG. 6B, it can be seen that on the flat plane Ge (110) substrate unlike the vicinal plane Ge (110) substrate, the hBN is not aligned in one direction.

Experimental Example 2: Comparison Between Dry
Stacking Process and Wet Stacking Process FIG. 7D shows AFM images for the bottom surface of each of the composite laminates one of which is prepared by a dry stacking process according to Example 1-1-1 and the other of which is prepared by a wet stacking process according to Comparative Example 2.

Referring to FIG. 7D, many wrinkles and bubbles are observed when electrochemical exfoliation is used (Comparative Example 2) instead of mechanical exfoliation (Example 1-1-1). This means that air or chemicals (residues) used for the electrochemical exfoliation is present between the electrochemically stacked graphene layers. These residues are reported to weaken the inter-electron interactions between stacked graphene layers (See Nano Lett. 2021, 21, 24, 10386-10391). However, graphene layers that are stacked through mechanical exfoliation are almost free of wrinkles and bubbles. The experimental result confirms that the stacked graphene layers are free of residues and exhibit strong interactions.

Experimental Example 3: Absorption Spectrum as a
Function of Number of Stacks (to Determine Stack
Yield)

Figure 8A:
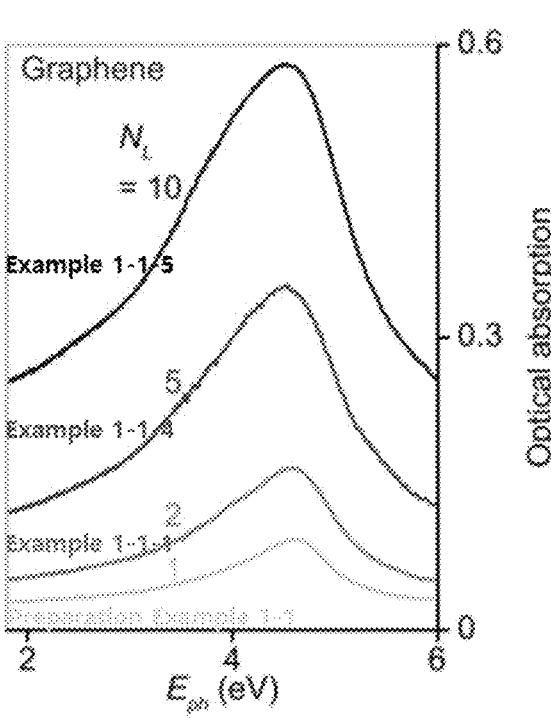
FIG. 8A is a diagram illustrating absorption spectra of multilayer structures of graphene according to the number of graphene layers according to Preparation Example 1-1 and Examples 1-1-1, 1-1-4, and 1-1-5.

FIG. 8A is a diagram illustrating absorption spectra of multilayer structures of graphene according to the number of stacked graphene layers according to Preparation Example 1-1 ($N_L$=1), Example 1-1-1 ($N_L$=2), Example 1-1-4 ($N_L$=5), and Example 1-1-5 ($N_L$=10).

Figure 8B:
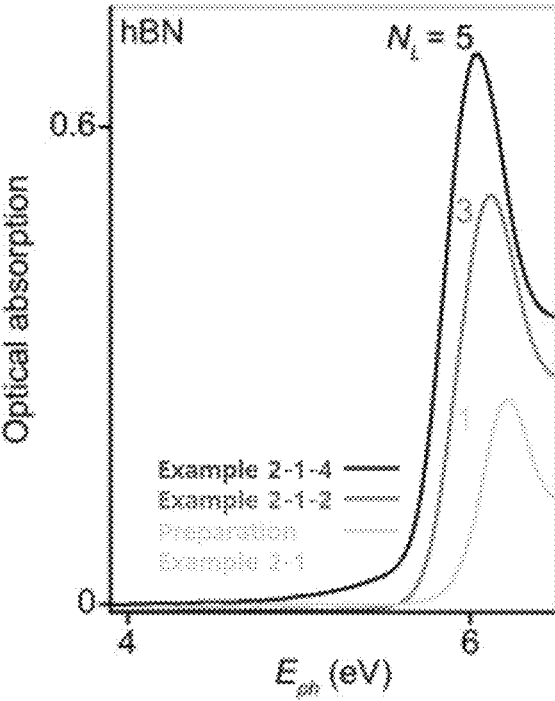
FIG. 8B is a diagram illustrating absorption spectra of multilayer structures of hexagonal boron nitride according to Preparation Example 2-1 and Examples 2-1-2 and 2-1-4.

FIG. 8B is a diagram illustrating absorption spectra of multilayer structures of hexagonal boron nitride (hBN) according to the number of stacked hexagonal boron nitride layers according to Preparation Example 2-1 ($N_L$=1), Example 2-1-2 ($N_L$=3), and Example 2-1-4 ($N_L$=5).

Figure 8C:
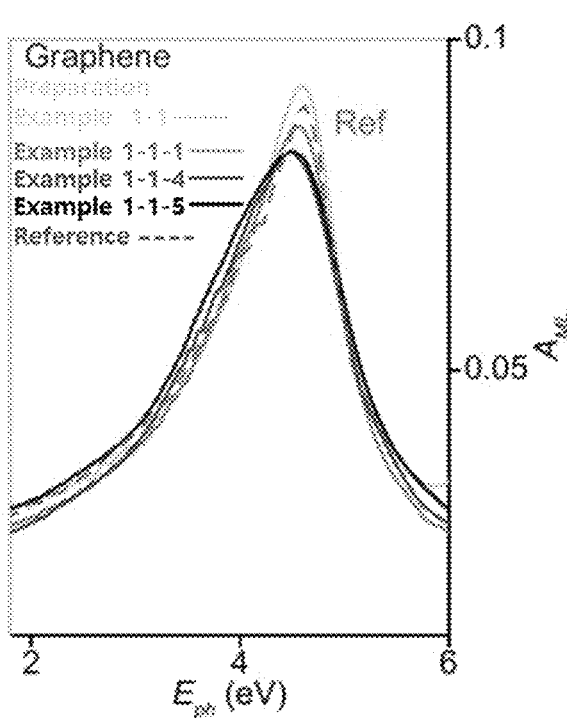
FIG. 8C is a diagram illustrating absorption spectra of multilayer structures of graphene divided by the number of stacked layers, according to Preparation Example 1-1 and Examples 1-1-1, 1-1-4, and 1-1-5.

FIG. 8C is a diagram illustrating absorption spectra of multilayer structures of graphene divided by the number of stacked graphene layers according to Preparation Example 1-1 ($N_L$=1), Example 1-1-1 ($N_L$=2), Example 1-1-4 ($N_L$=5), and Example 1-1-5 ($N_L$=10).

Figure 8D:
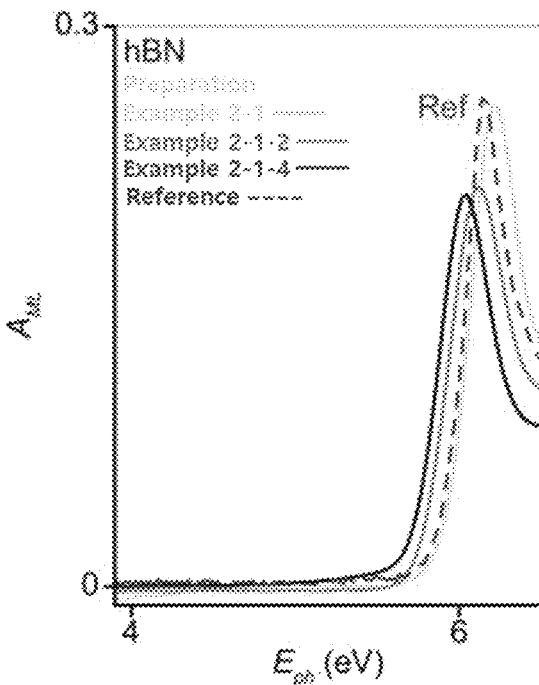
FIG. 8D is a diagram illustrating absorption spectra of multilayer structures of hexagonal boron nitride divided by the number of stacked layers, according to Preparation Example 2-1 and Examples 2-1-2 and 2-1-4.

FIG. 8D is a diagram illustrating absorption spectra of multilayer structures of hexagonal boron nitride (hBN) divided by the number of stacked hexagonal boron nitride layers according to Preparation Example 2-1 ($N_L$ 1), Example 2-1-2 ($N_L$-3), and Example 2-1-4 ($N_L$=5).

Referring to FIGS. 8A through 8D, it can be seen that the optical absorptivity linearly increases with increasing $N_L$, and the optical absorption measurements of the hBN multilayers show a single yield for the laminates over macroscale. In addition, the inferred $A_{ML}$ spectrum is consistent with the reference data (dashed line) and is similar to $N_L$ which is the number of stacks, indicating a stacking yield that is nearly matching.

Experimental Example 4: Investigation of Assembly of Graphene/hBN Heterogeneous Composite Laminates FIG. 9A is a schematic diagram of a graphene/hBN heterogeneous composite laminate according to Example 4-1, 9B is a laterally viewed STEM image of the composite laminate, and 9C illustrates electron energy loss spectroscopy (EELS) intensity images for carbon and nitrogen.

Figure 9A:
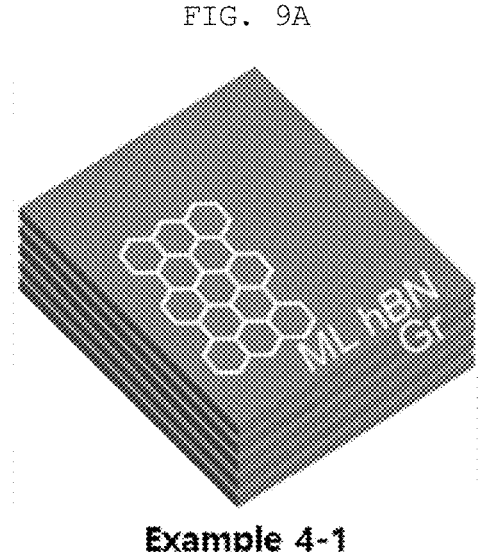
FIGS. 9A, 9B, and 9C are a schematic diagram, a laterally observed SEM image, and an EELS intensity image of carbon and nitrogen of a 2D material superlattice according to Example 4-1.
Figure 9B:
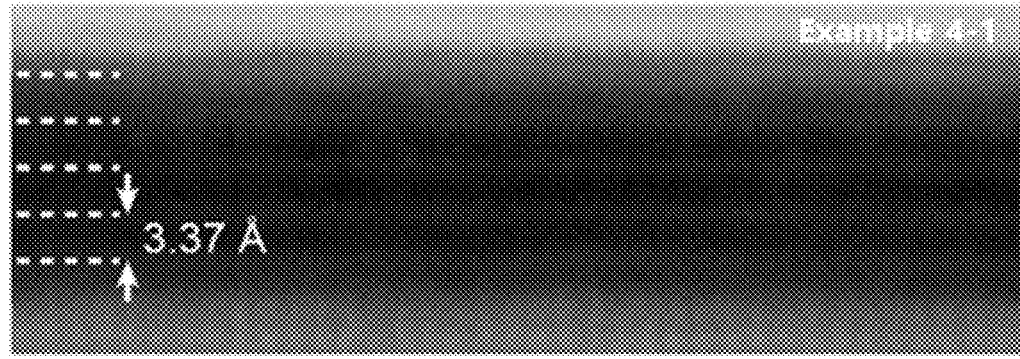
Figure 9C:
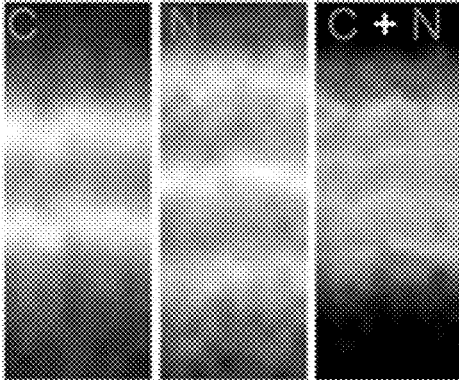

Referring to FIGS. 9A to 9C, the cross-sectional STEM image shows five parallel layers with clean interfaces with an interlayer spacing dz of 3.37 Å, which is close to the expected value for graphene and hBN. The EELS intensity images show a vertical chemical composition profile where C peaks and V peaks alternately appear along the out-of-plane direction. In addition, no additional signals indicating contaminants such as amorphous hydrocarbons are observed.

Figure 10B:
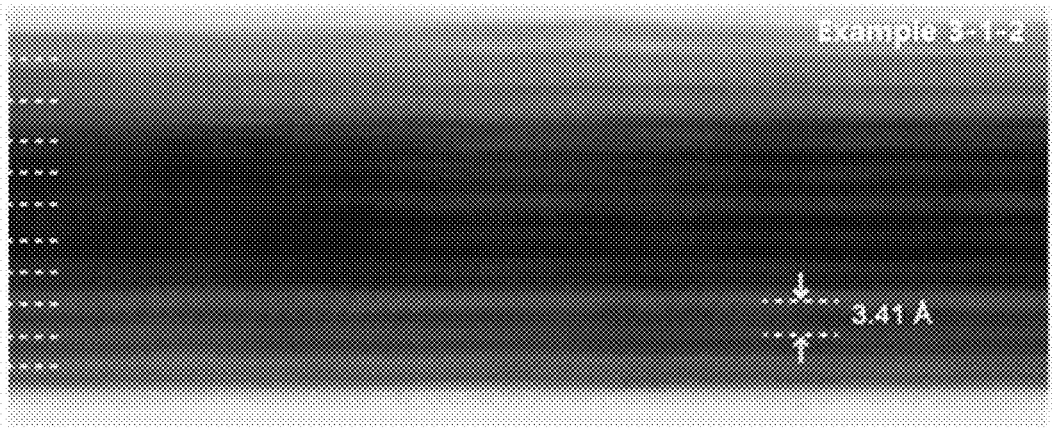
FIG. 10B is a laterally observed STEM image of the chiral composite laminate according to Example 3-1-2.
Figure 10C:
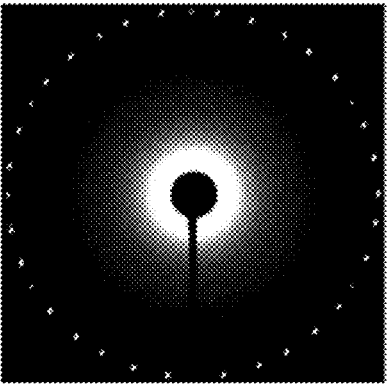
FIG. 10C is a top-down diffraction pattern according to Example 3-1-4.

Experimental Example 5: Investigation of Assembly of Composite Laminates According to Twist Angle FIG. 10A is a schematic view of a chiral composite laminate according to Example 3-1-2, FIG. 10B is a laterally observed STEM image of the chiral composite laminate according to Example 3-1-2, and FIG. 10C is a top-down diffraction pattern according to Example 3-1-4.

FIG. 11A is a schematic view of a stacked structure and expected band structure of a chiral composite laminate according to Example 3-1-1 and FIG. 11C illustrates ARPES data measured from crystals according to Example 3-1-1.

FIG. 11B is a schematic view of a stacked structure and expected band structure of an achiral composite laminate according to Example 3-1-3, and FIG. 11D illustrates ARPES data measured from crystals according to Example 3-1-3;

Referring to FIG. 11B and FIG. 11D, diffraction spots with rotation angles of 20° and −20° are shown. In the achiral composite laminate, the layers are stacked alternately with $\theta_1$=20°, −20°.

FIGS. 10A and 10B and FIG. 11A and FIG. 11C show the diffraction spots with rotational periodicity of ~20° and angular alignment within +1°. Referring to FIGS. 10A and 10B, it can be seen that the atomic structure of the chiral layer is that $N_L$=10 and $\theta_1$=20°, and the graphene layers are represented by 10 bright strips with a constant dz value of 3.41 Å, indicating 10 parallel layers with clean interfaces.

FIG. 10C illustrates a two-down diffraction pattern of the laminate where $N_L$=6 and $\theta_1$=10°.

Experimental Example 6: J-V Curve (Current Density-Voltage Characterization) of hBN Tunneling Barrier of Tunnel Device Including hBN Layers FIG. 12A illustrates a schematic diagram and an optical image of a tunnel device array including heterogeneous composite laminates according to one embodiment of the present disclosure.

Figure 12B:
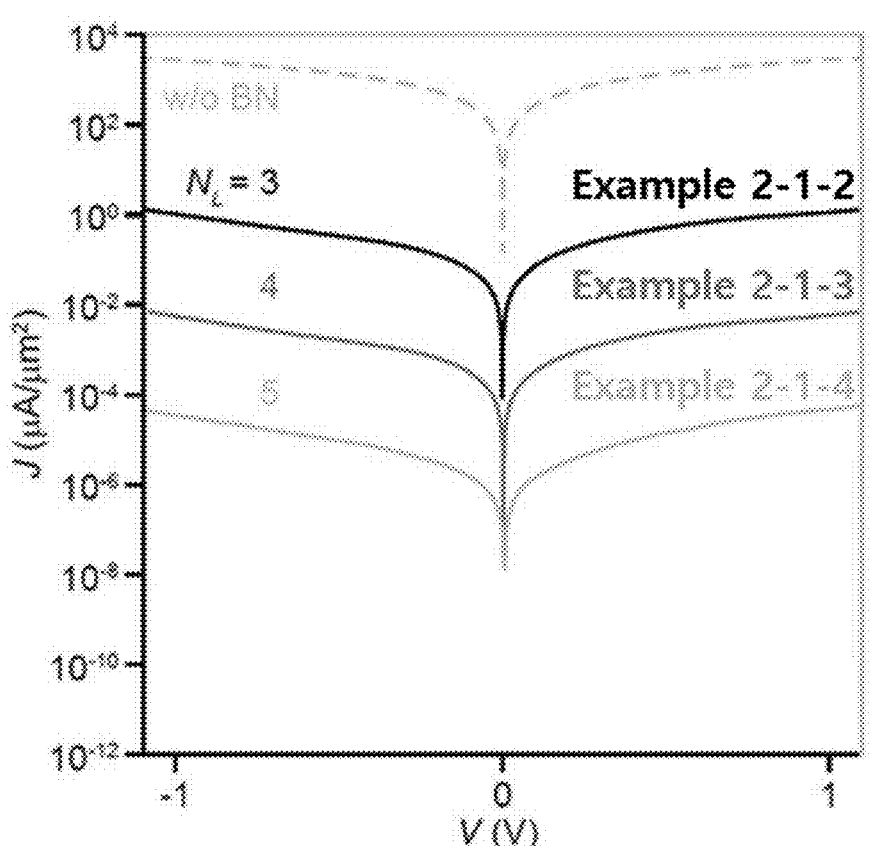
FIG. 12B is a graphical representation illustrating J-V curves of respective tunnel devices according to Examples 2-1-2 through 2-1-4.

FIG. 12B is a graphical representation illustrating J-V curves of respective tunnel devices according to Examples 2-1-2 through 2-1-4.

Centimeter-sized graphene layers were assembled with hBN layers of $N_L$=3, 4, and 5, and then the arrays were transferred to gold electrodes to form metal-insulator-metal junction arrays. The current density J, normalized by the junction area, was measured under ambient conditions.

Referring to FIGS. 12A and 12B, J decreased significantly by about 1% per layer with increase in $N_L$. The barrier height was deduced to be 3.0 eV with respect to the hole tunneling current, which was shown to be consistent with the energy difference between the maximum valence band and the Fermi level of hBN in graphene as measured by angle-resolved photoemission spectroscopy (ARPES).

Experimental Example 7: Comparison Between Copper Substrate and Ge (110) Substrate Referring to Nano Lett. 2012, 12, 1, 414-419; Adv.Mater.2019, 31, 1903039, it is known that in the case of graphene synthesized on a copper substrate (Comparative Example 1), mechanical transfer (the same method as in Example 1-1-1) cannot be utilized, and that chemical and air infiltration occurs between the stacked two-dimensional materials in the process of manufacturing a composite laminate through a wet stacking process. It is known that composite laminates containing foreign materials cannot have the physical properties that are caused by the interaction of the stacked two-dimensional materials. (See Nano Lett. 2021, 21, 24, 10386-10391)

Experimental Example 8: Confirmation of Composite Laminate Synthesis According to Partial Pressure Ratio

Experimental Example 8-1: Confirmation of Graphene Synthesis

The top diagram in FIG. 13A shows an LEED pattern for the case where graphene is aligned in one direction (0°), and the bottom diagram shows an LEED pattern for the case where graphene is aligned in two directions (0° and 30°). FIG. 13B is a diagram illustrating the alignment of graphene as a function of methane and hydrogen partial pressure ratio and synthesis temperature.

In FIG. 13B, the y-axis indicates the partial pressure ratio of hydrogen to methane, and the x-axis indicates the graphene synthesis temperature. For each synthesis condition (partial pressure ratio, temperature), the data shows that the better aligned graphene at 0° is dotted closer to 1 (red) on the bar, and the worse aligned graphene (° 0 and 30° mixed) is dotted closer to blue.

Experimental Example 8-2: Confirmation of Hexagonal Boron Nitride Synthesis

FIGS. 14A and 14B are plots showing data when hexagonal boron nitride is synthesized in two directions (0° and 60°) depending on the partial pressure ratio, FIG. 14C is a plot showing data when hexagonal boron nitride is aligned in one direction, and FIG. 14D is a plot showing data when hexagonal boron nitride is aligned in two directions.

Referring to FIGS. 14A and 14B, it can be confirmed that hexagonal boron nitride is synthesized in two directions (0° and 60°) when the partial pressure ratio is lower than 0.0003 or higher than 0.0007.

Referring to FIGS. 14C and 14D, FIG. 14C shows data for the case where hexagonal boron nitride is aligned in one direction at a partial pressure ratio of 0.0004, and FIG. 14D shows data for the case where hexagonal boron nitride is aligned in two directions at an inappropriate partial pressure ratio.

Experimental Example 9: Effect when Applied to an Electronic Device

Referring to Science 372, 1458-1462 (2021), hexagonal with a controlled stacking structure has boron nitride different properties than conventional ferroelectric materials. Ferroelectric tunneling devices using this material have no antipolarized electric field. These properties are essential for implementation of thin ferroelectric devices at the atomic level. However, conventional hexagonal boron nitride fabrication techniques cannot control the thickness and stacking structure over large areas.

The aligned hexagonal boron nitride (Preparation Example 2-2) synthesized on a vicinal plane and the dry stacking process proposed in the present disclosure can produce large-scale laminates (in FIG. 7E and Example 3-2, hexagonal boron nitride is made instead of graphene) and hexagonal boron nitride with a controlled thickness (Example 2-2). The technology is expected to be used in the fabrication of thin ferroelectrics at the atomic level and in the development of new electronic devices.

The scope of the present invention is defined by the following claims rather than the above detailed description, and all changes or modifications derived from the meaning and scope of the claims and their equivalent concepts should be interpreted as falling into the scope of the present invention.

What is claimed is:

1. A composite laminate comprising:

a first layer comprising a boron nitride layer comprising an atomic monolayer of hexagonal boron nitride (hBN);

a second layer positioned on the first layer and comprising an atomic monolayer of graphene; and a metal layer, wherein the metal layer is disposed on the first layer so as to be opposite to the second layer.

2. The composite laminate according to claim 1, wherein the first layer and the second layer are stacked in a direction perpendicular to an in-layer direction.

3. The composite laminate according to claim 1, wherein the composite laminate is used to fabricate a photodetector, polarizing film, transistor, or tunnel device.

4. A vicinal plane germanium laminate comprising:

a germanium (Ge) substrate having a vicinal plane (110) single crystalline surface;

a graphene layer or hexagonal boron nitride layer formed on the vicinal plane (110) single crystalline surface of the Ge substrate; and a metal layer, wherein the metal layer is disposed on the graphene layer or hexagonal boron nitride layer so as to be opposite to the Ge substrate.

5. The vicinal plane germanium laminate according to claim 4, wherein the vicinal plane (110) single crystalline surface of the Ge substrate is formed by cutting a Ge substrate in <100> or <111> direction and then recrystallizing the resulting Ge substrate.

6. The vicinal plane germanium laminate according to claim 4, wherein single crystals of the graphene layer or hexagonal boron nitride layer have same orientation.

7. A method of fabricating a composite laminate, the method comprising:

(a) forming a first layer comprising a first boron nitride layer comprising hexagonal boron nitride (hBN) or a first graphene layer comprising graphene on a first germanium (Ge) substrate;

(b) forming a second layer comprising a second boron nitride layer comprising hexagonal boron nitride or a second graphene layer comprising graphene on a second germanium (Ge) substrate;

(c) bringing a metal thin film of a release film coated with the metal thin film into contact with the first layer of the first Ge substrate, mechanically exfoliating the first layer from the first Ge layer, and transferring the exfoliated first layer onto the metal thin film of the release film; and (d) bringing the first layer transferred onto the metal thin film of the release film into contact with the second layer formed on the second Ge substrate, mechanically exfoliating the second layer from the second Ge substrate, and transferring the exfoliated second layer onto the first layer, thereby forming the composite laminate in which the second layer is disposed on the first layer.

8. The method according to claim 7, wherein the mechanically exfoliating is performed by utilizing a difference in the Van der Waals attraction.

9. The method according to claim 8, wherein the van der Waals attraction between the metal thin film and the first layer is greater than the van der Waals attraction between the first layer and the first Ge substrate, and the van der Waals attraction between the first layer and the second layer is greater than the van der Waals attraction between the second layer and the second Ge substrate.

10. The method according to claim 7, wherein the Ge substrate has a Ge (110) single crystalline surface or a Ge (110) single crystalline surface with a vicinal plane.

11. The method according to claim 10, wherein the vicinal plane (110) single crystalline surface of the Ge substrate is formed by cutting a Ge substrate in <100> or <111> direction and then recrystallizing the resulting Ge substrate.

12. The method according to claim 7, wherein the first layer in step (a) or the second layer in step (b) are formed by chemical vapor deposition (CVD).

* * * * *